United States Patent
Park et al.

(10) Patent No.: US 12,199,640 B2
(45) Date of Patent: Jan. 14, 2025

(54) METHOD AND APPARATUS FOR RECEIVING PPDU IN WHICH DATA IS DUPLICATED IN WIRELESS LAN SYSTEM

(71) Applicant: LG Electronics Inc., Seoul (KR)

(72) Inventors: Eunsung Park, Seoul (KR); Jinyoung Chun, Seoul (KR); Jinsoo Choi, Seoul (KR); Dongguk Lim, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 18/010,979

(22) PCT Filed: Jun. 30, 2021

(86) PCT No.: PCT/KR2021/008251
§ 371 (c)(1),
(2) Date: Dec. 16, 2022

(87) PCT Pub. No.: WO2022/005196
PCT Pub. Date: Jan. 6, 2022

(65) Prior Publication Data
US 2023/0268934 A1    Aug. 24, 2023

(30) Foreign Application Priority Data

Jul. 1, 2020 (KR) .................. 10-2020-0081059
Jul. 8, 2020 (KR) .................. 10-2020-0084222
Aug. 26, 2020 (KR) .................. 10-2020-0108006

(51) Int. Cl.
*H03M 13/00* (2006.01)
*H03M 13/25* (2006.01)
(Continued)

(52) U.S. Cl.
CPC ........ *H03M 13/255* (2013.01); *H04L 1/0003* (2013.01); *H04W 74/006* (2013.01); *H04W 84/12* (2013.01)

(58) Field of Classification Search
CPC . H03M 13/255; H04W 84/12; H04W 74/006; H04L 1/0003
See application file for complete search history.

(56) References Cited

U.S. PATENT DOCUMENTS 9,832,058 B2 * 11/2017 Lee .................. H04L 27/2621
10,097,393 B1 * 10/2018 Huang ............... H04L 27/2634
(Continued)

FOREIGN PATENT DOCUMENTS

| KR | 20160081832 | 7/2016 |
| KR | 20200034756 | 3/2020 |
| WO | WO 2020/022707 | 1/2020 |

OTHER PUBLICATIONS

Extended European Search Report in European Appln. No. 21831714.7, mailed on Oct. 30, 2023, 8 pages.
(Continued)

*Primary Examiner* — Esaw T Abraham
(74) *Attorney, Agent, or Firm* — Fish & Richardson P.C.

(57) ABSTRACT

Proposed are a method and apparatus for receiving a PPDU in a wireless LAN system. In detail, a reception STA receives a PPDU from a transmission STA through a first band and decodes the PPDU. The PPDU includes a preamble and a data field. The first band includes first and second subblocks. The data field includes first data for the first subblock and second data for the second subblock. The first data is generated on the basis of data in which constellation mapping is performed on encoded data bits. The second data is generated on the basis of data obtaining by duplicating the first data and applying phase rotation thereto.

13 Claims, 28 Drawing Sheets

(51) Int. Cl.
   *H04L 1/00*   (2006.01)
   *H04W 74/00*  (2009.01)
   *H04W 84/12*  (2009.01)

(56) References Cited

U.S. PATENT DOCUMENTS

| | | | | |
|---|---|---|---|---|
| 10,412,610 | B2* | 9/2019 | Moon | H04W 72/0446 |
| 10,932,229 | B2* | 2/2021 | Lou | H04L 5/003 |
| 10,979,266 | B2* | 4/2021 | Son | H04L 27/2605 |
| 11,272,490 | B2* | 3/2022 | Verma | H04B 7/0452 |
| 2011/0305178 | A1* | 12/2011 | Zheng | H04W 52/16 |
| | | | | 370/311 |
| 2013/0242963 | A1* | 9/2013 | Van Nee | H04L 27/2615 |
| | | | | 370/338 |
| 2016/0007342 | A1* | 1/2016 | Seok | H04L 27/2602 |
| | | | | 370/338 |
| 2016/0119047 | A1* | 4/2016 | Lee | H04B 7/0617 |
| | | | | 370/329 |
| 2016/0127948 | A1* | 5/2016 | Azizi | H04W 28/18 |
| | | | | 370/338 |
| 2016/0286551 | A1 | 9/2016 | Lee et al. | |
| 2017/0170932 | A1 | 6/2017 | Chu et al. | |
| 2022/0361170 | A1 | 11/2022 | Park et al. | |

OTHER PUBLICATIONS

Lim et al., "11be PPDU format," IEEE 802.11-20/0019r4, Jan. 2020, 16 pages.

Lim et al., "Signaling of RU allocation in 11be," IEEE 802.11-20/0652, Apr. 2020, 20 pages.

Liu & Hu, "Multiple RU Combinations for Eht," IEEE 802.11-19/1907r2, Nov. 2019, 32 pages.

\* cited by examiner

FIG. 1
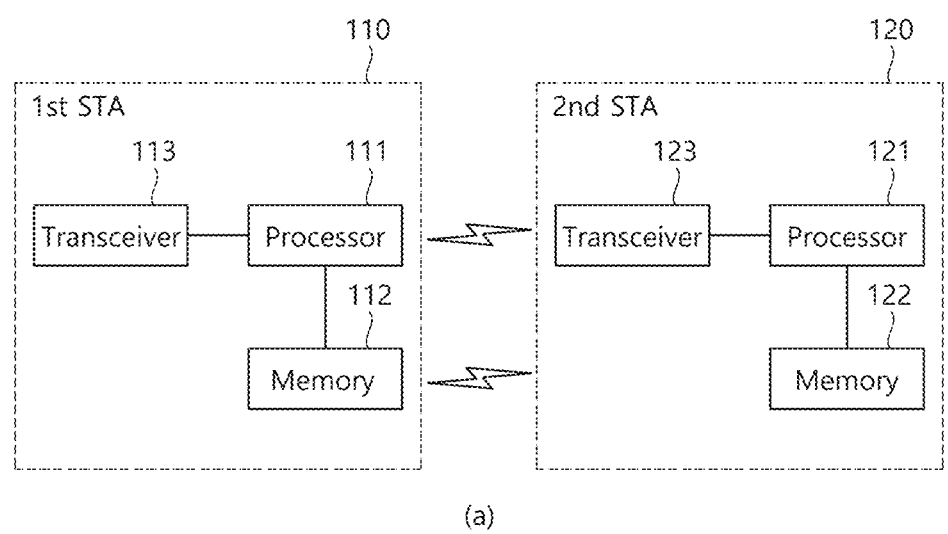
(a)
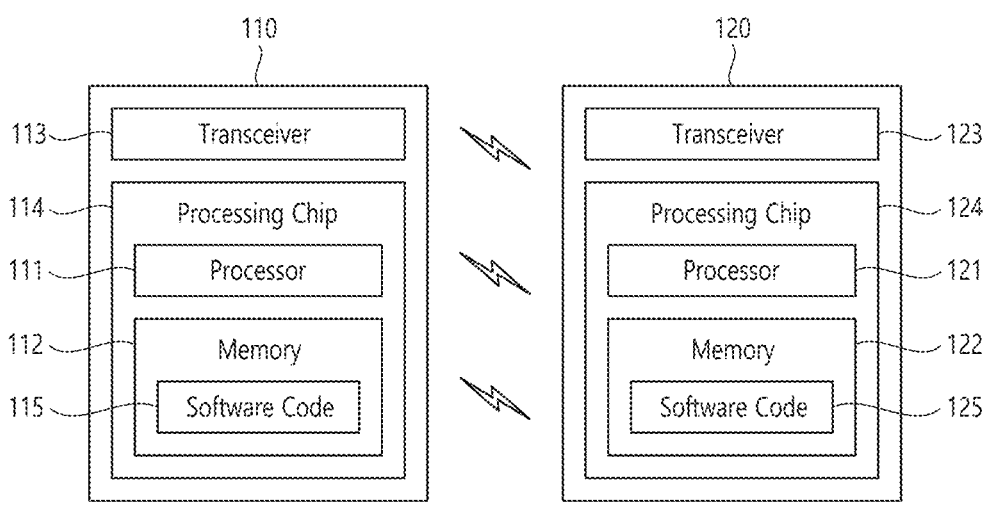
(b)

FIG. 2
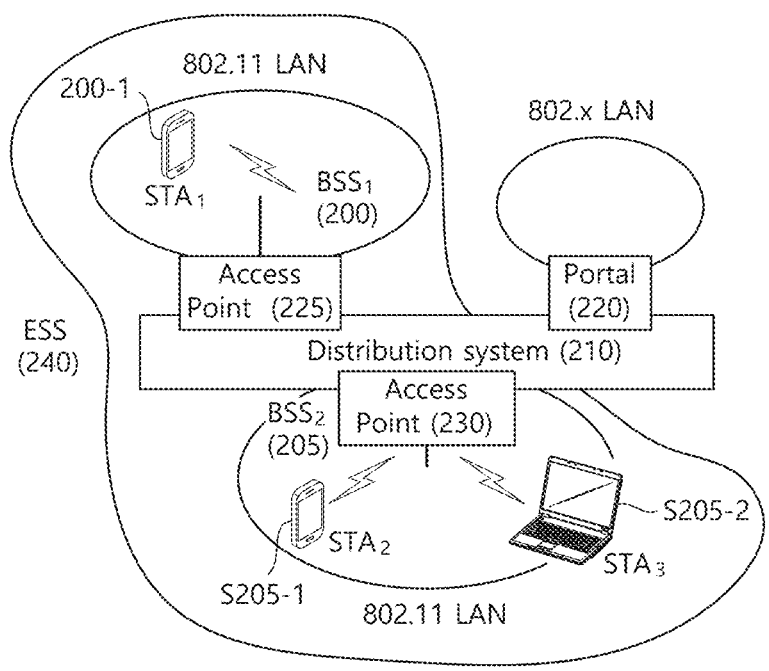
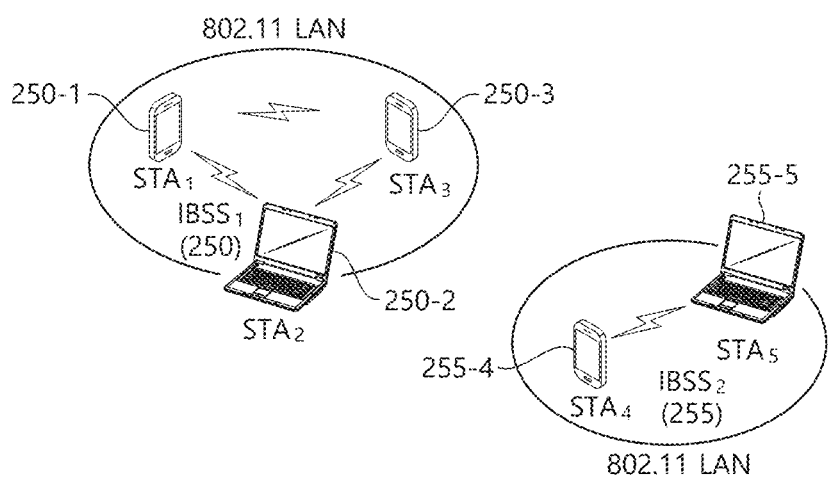

FIG. 4

| L-LTF | L-STF | L-SIG | Data |

PPDU Format (IEEE 802.11a/g)

| L-LTF | L-STF | L-SIG | SIG A | HT-SFT | HT-LFT | ... | HT-LFT | Data |

HT PPDU Format (IEEE 802.11n)

| L-LTF | L-STF | L-SIG | VHT-SIG A | VHT-SFT | VHT-LFT | VHT-SIG B | Data |

VHT PPDU Format (IEEE 802.11ac)

| 8μs | 8μs | 4μs | 4μs | 8μs | 4μs per symbol | 4μs | Variable durations per HE-LTF symbol | | |
|---|---|---|---|---|---|---|---|---|---|
| L-LTF | L-STF | L-SIG | RL-SIG | HE-SIG A | HE-SIG B | HE-STF | HE-LTF | ... | HE-LTF | Data | PE |

FIG. 9

RU Allocation subfield 01000y₂ y₁ y₀ = 01000010

| User field 1 | User field 2 | User field 3 | User field 4 | User field 5 | User field 6 | User field 7 | User field 8 |

MU-MIMO allocation

| RU assignment | 106-tone | 26-tone | 26-tone | 26-tone | 26-tone | 26-tone | 26-tone |
|---|---|---|---|---|---|---|---|
| Number of users per RU | 3 | 1 | 1 | 1 | 1 | 1 | 1 |

FIG. 10

| L-STF | L-LTF | L-SIG | RL-SIG | U-SIG | EHT-SIG | EHT-STF | EHT-LTF | Data |

FIG. 22

| 8 bits indices (B7 B6 B5 B4 B3 B2 B1 B0) | #1 | #2 | #3 | #4 | #5 | #6 | #7 | #8 | #9 | Number of entries |
|---|---|---|---|---|---|---|---|---|---|---|
| 00000000 | 26 | 26 | 26 | 26 | 26 | 26 | 26 | 26 | 26 | 1 |
| 00000001 | 26 | 26 | 26 | 26 | 26 | 26 | 26 | 52 | | 1 |
| 00000010 | 26 | 26 | 26 | 26 | 26 | 52 | | 26 | 26 | 1 |
| 00000011 | 26 | 26 | 26 | 26 | 26 | 52 | | 52 | | 1 |
| 00000100 | 26 | 26 | 52 | | 26 | 26 | 26 | 26 | 26 | 1 |
| 00000101 | 26 | 26 | 52 | | 26 | 26 | 26 | 52 | | 1 |
| 00000110 | 26 | 26 | 52 | | 26 | 52 | | 26 | 26 | 1 |
| 00000111 | 26 | 26 | 52 | | 26 | 52 | | 52 | | 1 |
| 00001000 | 52 | | 26 | 26 | 26 | 26 | 26 | 26 | 26 | 1 |

FIG. 23

| 8 bits indices (B7 B6 B5 B4 B3 B2 B1 B0) | #1 | #2 | #3 | #4 | #5 | #6 | #7 | #8 | #9 | Number of entries |
|---|---|---|---|---|---|---|---|---|---|---|
| 01000$y_2 y_1 y_0$ | 106 | | | | 26 | 26 | 26 | 26 | 26 | 8 |
| 01001$y_2 y_1 y_0$ | 106 | | | | 26 | 26 | 26 | 52 | | 8 |

FIG. 24

| Channel Width | RU Size | Null Subcarrier Indices |
|---|---|---|
| 20 MHz | 26, 52 | ±69, ±122 |
| | 106 | none |
| | 242 | none |
| 40 MHz | 26, 52 | ±3, ±56, ±57, ±110, ±137, ±190, ±191, ±244 |
| | 106 | ±3, ±110, ±137, ±244 |
| | 242, 484 | none |
| 80 MHz | 26, 52 | ±17, ±70, ±71, ±124, ±151, ±204, ±205, ±258, ±259, ±312, ±313, ±366, ±393, ±446, ±447, ±500 |
| | 106 | ±17, ±124, ±151, ±258, ±259, ±366, ±393, ±500 |
| | 242, 484 | none |
| | 996 | none |
| 160 MHz | 26, 52, 106 | {null subcarrier indices in 80 MHz − 512, null subcarrier indices in 80 MHz + 512} |
| | 242, 484, 996, 2×996 | none |

FIG. 25

| Channel Width | RU Size | Pilot Subcarrier Indices |
|---|---|---|
| 20 MHz | 26, 52 | ±10, ±22, ±36, ±48, ±62, ±76, ±90, ±102, ±116 |
| | 106, 242 | ±22, ±48, ±90, ±116 |
| 40 MHz | 26, 52 | ±10, ±24, ±36, ±50, ±64, ±78, ±90, ±104, ±116, ±130, ±144, ±158, ±170, ±184, ±198, ±212, ±224, ±238 |
| | 106, 242, 484 | ±10, ±36, ±78, ±104, ±144, ±170, ±212, ±238 |

FIG. 26

| Channel Width | RU Size | Pilot Subcarrier Indices |
|---|---|---|
| 80 MHz | 26, 52 | ±10, ±24, ±38, ±50, ±64, ±78, ±92, ±104, ±118, ±130, ±144, ±158, ±172, ±184, ±198, ±212, ±226, ±238, ±252, ±266, ±280, ±292, ±306, ±320, ±334, ±346, ±360, ±372, ±386, ±400, ±414, ±426, ±440, ±454, ±468, ±480, ±494 |
| | 106, 242, 484 | ±24, ±50, ±92, ±118, ±158, ±184, ±226, ±252, ±266, ±292, ±334, ±360, ±400, ±426, ±468, ±494 |
| | 996 | ±24, ±92, ±158, ±226, ±266, ±334, ±400, ±468 |
| 160 MHz | 26, 52, 106, 242, 484 | {pilot subcarrier indices in 80 MHz −512, pilot subcarrier indices in 80 MHz +512} |
| | 996 | {for the lower 80 MHz, pilot subcarrier indices in 80 MHz −512, for the upper 80 MHz, pilot subcarrier indices in 80 MHz +512} |

FIG. 27

For BPSK modulation with DCM, the input stream is broken into groups of $N_{CBPS}$ or $N_{CBPS,u}$ bits $(B_0, B_1, ..., B_{N_{CBPS,u}-1})$. Each bit $B_k$ is BPSK modulated to a sample $d'_k$. This generates the samples for the lower half of the data subcarriers. For the upper half of the subcarriers, the samples are generated as $d'_{k+N_{SD}} = d'_k \times e^{j(k+N_{SD})\pi}$, $k = 0, 1, ..., N_{SD} - 1$. The $N_{SD}$ here refers to the $N_{SD}$ with DCM = 1, which is half the value of $N_{SD}$ with DCM = 0.

For QPSK modulation with DCM, the input stream is broken into groups of $N_{CBPS}$ or $N_{CBPS,u}$ bits $(B_0, B_1, ..., B_{N_{CBPS,u}-1})$. Each pair of bits $(B_{2k}, B_{2k+1})$ is QPSK modulated to a symbol $d'_k$. This generates the constellation points for the lower half the data subcarriers in the RU. For the upper half of the data subcarriers in the RU, $d'_{k+N_{SD}} = conj(d'_k)$, where $conj()$ represents the complex conjugate operation. The $N_{SD}$ here refers to the $N_{SD}$ with DCM = 1, which is half the value of $N_{SD}$ with DCM = 0.

For 16-QAM modulation with DCM, the input stream is broken into groups of $N_{CBPS}$ or $N_{CBPS,u}$ bits $(B_0, B_1, ..., B_{N_{CBPS,u}-1})$. A group of 4 bits $(B_{4k}, B_{4k+1}, B_{4k+2}, B_{4k+3})$ is 16-QAM modulated to a sample $d'_k$ as described in 17.3.5.8 (Subcarrier modulation mapping). This is the sample on subcarrier $k$ in the lower half. In the upper half, the sample $d'_{k+N_{SD}}$ on subcarrier $k + N_{SD}$ is obtained by 16-QAM modulating a permutation of the bits $(B_{4k}, B_{4k+1}, B_{4k+2}, B_{4k+3})$. Specifically, $d'_{k+N_{SD}}$ is obtained by applying the 16-QAM modulation procedure in 18.3.5.8 to the bit group $(B_{4k+1}, B_{4k}, B_{4k+3}, B_{4k+2})$. The $N_{SD}$ here refers to the $N_{SD}$ with DCM = 1, which is half the value of $N_{SD}$ with DCM = 0.

FIG. 28

| Parameter | 20 MHz | 40 MHz | 80 MHz | 160 MHz, 80+80 MHz |
|---|---|---|---|---|
| $D_{TM}$ | 4 | 6 | 9 | 9 |

FIG. 29

$d''_{(k),i,n,u} = d'_{k,i,n,u}$; $k = 0, 1, ..., N_{SD} - 1$ for 20 MHz, 40 MHz, 80 MHz and 80+80 MHz;
$k = 0, 1, ..., N_{SD}/2 - 1$ for 160 MHz;
$i = 1, ..., N_{SS}$;
$n = 0, 1, ..., N_{SYM} - 1$;
$l = 0$ for 20 MHz, 40 MHz, and 80 MHz;
$l = 0, 1$ for 160 MHz and 80+80 MHz;
$u = 0, ..., N_{user} - 1$ where $t(k) = \begin{cases} D_{TM}(k \mod N_{SD}/D_{TM}) + \lfloor k*D_{TM}/N_{SD} \rfloor, \text{ for 20 MHz, 40 MHz, 80 MHz, and 80+80 MHz} \\ D_{TM}(k \mod N_{SD}/2/D_{TM}) + \lfloor k*D_{TM}/N_{SD}/2 \rfloor, \text{ for 160 MHz} \end{cases}$

$k = 0, 1, \ldots, N_{SD} - 1$ for 20 MHz, 40 MHz, 80 MHz and 80+80 MHz;

$k = 0, 1, \ldots, \frac{N_{SD}}{2} - 1$ for 160 MHz, $i = 1, \ldots, N_{SS,u};$ $n = 0, 1, \ldots, N_{SYM} - 1;$ $l = 0$ for 20 MHz, 40 MHz, and 80 MHz;

$l = 0, 1$ for 160 MHz and 80+80 MHz;

$u = 0, \ldots, N_{user} - 1$

FIG. 31

| Parameter | RU Size (tones) | | | | | | |
|---|---|---|---|---|---|---|---|
| | 26 | 52 | 106 | 242 | 484 | 996 | 2×996 |
| $D_{TM}$ | 1 | 3 | 6 | 9 | 12 | 20 | 20 |
| $D_{TM\_DCM}$ | 1 | 1 | 3 | 9 | 9 | 14 | 14 |

where $k = \begin{cases} 0, 1, \ldots, N_{SD} - 1 & \text{for a 26-, 52-, 106-, 242-, 484- and 996-tone RU} \\ 0, 1, \ldots, N_{SD}/2 - 1 & \text{for a 2×996-tone RU} \end{cases}$ $i = 1, \ldots, N_{SS,r,u}$ $n = 0, 1, \ldots, N_{SYM} - 1$ $l = \begin{cases} 0 & \text{for a 26-, 52-, 106-, 242-, 484- and 996-tone RU} \\ 0, 1 & \text{for a 2×996-tone RU} \end{cases}$ $u = 0, \ldots, N_{user,r} - 1$ $r = 0, \ldots, N_{RU} - 1$ $N_{SD}$ is the number of data tones in the $r$-th RU $t(k) = \begin{cases} D_{TM}\left(k \bmod \frac{N_{SD}}{D_{TM}}\right) + \left\lfloor \frac{k \cdot D_{TM}}{N_{SD}} \right\rfloor, & \text{for a 26-, 52-, 106-, 242-, 484- and 996-tone RU} \\ D_{TM}\left(k \bmod \frac{N_{SD}/2}{D_{TM}}\right) + \left\lfloor \frac{k \cdot D_{TM}}{N_{SD}/2} \right\rfloor, & \text{for a 2×996-tone RU} \end{cases}$

where $k = \begin{cases} 0, 1, ..., 2*N_{SD}-1 \text{ for a } 26\text{-}, 52\text{-}, 106\text{-}, 242\text{-}, 484\text{- and } 996\text{-tone RU} \\ 0, 1, ..., N_{SD}-1 \text{ for a } 2\times996\text{-tone RU} \end{cases}$ $i = 1, ..., N_{SS,r,u}$ $n = 0, 1, ..., N_{SYM}-1$ $l = \begin{cases} 0 \text{ for a } 26\text{-}, 52\text{-}, 106\text{-}, 242\text{-}, 484\text{- and } 996\text{-tone RU} \\ 0, 1 \text{ for a } 2\times996\text{-tone RU} \end{cases}$ $u = 0, ..., N_{user,r}-1$ $r = 0, ..., N_{RU}-1$ $N_{SD}$ is the number of data tones in the r-th RU if DCM is applied For a 26-, 52-, 106-, 242-, 484- and 996-tone RU, $t(k) = \begin{cases} D_{TM,DCM}(k \bmod N_{SD}/D_{TM,DCM}) + \lfloor k*D_{TM,DCM}/N_{SD} \rfloor, \text{ for } k < N_{SD} \\ D_{TM,DCM}((k-N_{SD}) \bmod N_{SD}/D_{TM,DCM}) + \lfloor (k-N_{SD})*D_{TM,DCM}/N_{SD} \rfloor + N_{SD}, \text{ for } k >= N_{SD} \end{cases}$ For a 2x996-tone RU, $t(k) = \begin{cases} D_{TM,DCM}(k \bmod N_{SD}/2/D_{TM,DCM}) + \lfloor k*D_{TM,DCM}/N_{SD}/2 \rfloor, \text{ for } 0 <= k < N_{SD}/2 \\ D_{TM,DCM}((k-N_{SD}/2) \bmod N_{SD}/2/D_{TM,DCM}) + \lfloor (k-N_{SD}/2)*D_{TM,DCM}/N_{SD}/2 \rfloor + N_{SD}/2, \text{ for } N_{SD}/2 <= k < N_{SD} \end{cases}$ $D_{TM,DCM}$ is the LDPC tone mapping distance for the r-th RU if DCM is applied.

where $k = \begin{cases} 0, 1, ..., N_{SD} - 1 \text{ for a } 26\text{-}, 52\text{-}, 106\text{-}, 242\text{-}, 484\text{- and } 996\text{-tone RU} \\ 0, 1, ..., N_{SD}/2 - 1 \text{ for a } 2\times996\text{-tone RU} \end{cases}$ $i = 1, ..., N_{SS,r,u}$ $n = 0, 1, ..., N_{SYM} - 1$ $l = \begin{cases} 0 \text{ for a } 26\text{-}, 52\text{-}, 106\text{-}, 242\text{-}, 484\text{- and } 996\text{-tone RU} \\ 0, 1 \text{ for a } 2\times996\text{-tone RU} \end{cases}$ $u = 0, ..., N_{user,r} - 1$ $r = 0, ..., N_{RU} - 1$

where $$k = \begin{cases} 0, 1, ..., N_{SD} - 1 \text{ for a 26-, 52-, 106-, 242-, 484- and 996-tone RU} \\ 0, 1, ..., N_{SD}/2 - 1 \text{ for a 2×996-tone RU} \end{cases}$$

$$i = 1, ..., N_{SS,r,u}$$

$$n = 0, 1, ..., N_{SYM} - 1$$

$$l = \begin{cases} 0 \text{ for a 26-, 52-, 106-, 242-, 484- and 996-tone RU} \\ 0, 1 \text{ for a 2×996-tone RU} \end{cases}$$

$$u = 0, ..., N_{user,r} - 1$$

$$r = 0, ..., N_{RU} - 1$$

$N_{SD}$ is the number of data tones in the $r$-th RU $$x(k) = \begin{cases} D_{TM}\left(k \bmod \dfrac{N_{SD}}{D_{TM}}\right) + \left\lfloor \dfrac{k \cdot D_{TM}}{N_{SD}} \right\rfloor, \text{ for a 26-, 52-, 106-, 242-, 484- and 996-tone RU} \\ D_{TM}\left(k \bmod \dfrac{N_{SD}/2}{D_{TM}}\right) + \left\lfloor \dfrac{k \cdot D_{TM}}{N_{SD}/2} \right\rfloor, \text{ for a 2×996-tone RU} \end{cases}$$

where $$k = \begin{cases} 0, 1, \ldots, 2N_{SD} - 1 \text{ for a 26-, 52-, 106-, 242-, 484- and 996-tone RU} \\ 0, 1, \ldots, N_{SD} - 1 \text{ for a 2×996-tone RU} \end{cases}$$

$i = 1, \ldots, N_{SS,r,u}$ $n = 0, 1, \ldots, N_{STAT} - 1$ $$l = \begin{cases} 0 \text{ for a 26-, 52-, 106-, 242-, 484- and 996-tone RU} \\ 0, 1 \text{ for a 2×996-tone RU} \end{cases}$$

$u = 0, \ldots, N_{user,r} - 1$ $r = 0, \ldots, N_{RU} - 1$ $N_{SD}$ is the number of data tones in the $r$-th RU if DCM is applied For a 26-, 52-, 106-, 242-, 484- and 996-tone RU, $$\kappa(k) = \begin{cases} D_{TM\_DCM}\left(k \bmod \frac{N_{SD}}{D_{TM\_DCM}}\right) + \left\lfloor \frac{k \cdot D_{TM\_DCM}}{N_{SD}} \right\rfloor & \text{for } k < N_{SD} \\ D_{TM\_DCM}\left((k - N_{SD}) \bmod \frac{N_{SD}}{D_{TM\_DCM}}\right) + \left\lfloor \frac{(k - N_{SD}) \cdot D_{TM\_DCM}}{N_{SD}} \right\rfloor + N_{SD}, & \text{for } k \geq N_{SD} \end{cases}$$

For a 2×996-tone RU, $$\kappa(k) = \begin{cases} D_{TM\_DCM}\left(k \bmod \frac{N_{SD}/2}{D_{TM\_DCM}}\right) + \left\lfloor \frac{k \cdot D_{TM\_DCM}}{N_{SD}/2} \right\rfloor & \text{for } 0 \leq k < N_{SD}/2 \\ D_{TM\_DCM}\left((k - N_{SD}/2) \bmod \frac{N_{SD}/2}{D_{TM\_DCM}}\right) + \left\lfloor \frac{(k - N_{SD}/2) \cdot D_{TM\_DCM}}{N_{SD}/2} \right\rfloor + N_{SD}/2, & \text{for } N_{SD}/2 \leq k < N_{SD} \end{cases}$$

METHOD AND APPARATUS FOR RECEIVING PPDU IN WHICH DATA IS DUPLICATED IN WIRELESS LAN SYSTEM

CROSS-REFERENCE TO RELATED APPLICATIONS

This application is a National Stage application under 35 U.S.C. § 371 of International Application No. PCT/KR2021/008251, filed on Jun. 30, 2021, which claims the benefit of Korean Patent Application No. 10-2020-0081059, filed on Jul. 1, 2020, Korean Patent Application No. 10-2020-0084222, filed on Jul. 8, 2020, and Korean Patent Application No. 10-2020-0108006, filed on Aug. 26, 2020. The disclosures of the prior applications are incorporated by reference in their entirety.

TECHNICAL FIELD

The present specification relates to a method for receiving a PPDU in a wireless local area network (WLAN) system and, most particularly, to a method and apparatus for receiving a PPDU in which data is duplicated.

BACKGROUND

A wireless local area network (WLAN) has been improved in various ways. For example, the IEEE 802.11ax standard proposed an improved communication environment using orthogonal frequency division multiple access (OFDMA) and downlink multi-user multiple input multiple output (DL MU MIMO) techniques.

The present specification proposes a technical feature that can be utilized in a new communication standard. For example, the new communication standard may be an extreme high throughput (EHT) standard which is currently being discussed. The EHT standard may use an increased bandwidth, an enhanced PHY layer protocol data unit (PPDU) structure, an enhanced sequence, a hybrid automatic repeat request (HARQ) scheme, or the like, which is newly proposed. The EHT standard may be called the IEEE 802.11be standard.

In a new WLAN standard, an increased number of spatial streams may be used. In this case, in order to properly use the increased number of spatial streams, a signaling technique in the WLAN system may need to be improved.

SUMMARY

The present specification proposes a method and apparatus for receiving a PPDU in which data is duplicated in a wireless LAN system.

An example of the present specification proposes a method for receiving a PPDU in which data is duplicated.

The present embodiment may be performed in a network environment in which a next generation WLAN system (IEEE 802.11be or EHT WLAN system) is supported. The next generation wireless LAN system is a WLAN system that is enhanced from an 802.11ax system and may, therefore, satisfy backward compatibility with the 802.11ax system.

This embodiment proposes a method and apparatus for duplicating and transmitting data in order to increase a transmission distance in transmission of an EHT PPDU. The 802.11be wireless LAN system can support transmission in an indoor environment using low power in a broadband of 6 GHz. Accordingly, in order to obtain more reliable performance, a method of repeatedly transmitting data in the frequency domain in the EHT PPDU is proposed.

A receiving station (STA) receives a Physical Protocol Data Unit (PPDU) from a transmitting STA through a first band.

The receiving STA decodes the PPDU.

The PPDU may be an Extremely High Throughput (EHT) PPDU supporting an 802.11be wireless LAN system. The PPDU includes a preamble and a data field. The preamble is a Legacy-Short Training Field (L-STF), a Legacy-Long Training Field (L-LTF), a Legacy-Signal (L-SIG), an Universal-Signal (U-SIG), an EHT-SIG, an EHT-STF and an EHT-LTF.

The first band includes first and second subblocks. The data field includes first data for the first subblock and second data for the second subblock. The first data is generated based on data obtained by performing constellation mapping on encoded data bits. The second data is generated based on data obtained by duplicating the first data and applying phase rotation thereto.

According to the embodiment proposed in this specification, by dividing the entire band for transmitting the PPDU into subblocks and repeatedly transmitting data for each subblock, reliable performance can be obtained even for transmission over a longer distance. As a result, there is an effect of increasing the transmission range of the PPDU of the transmitter and improving overall performance.

BRIEF DESCRIPTION OF THE DRAWINGS

FIG. 1 shows an example of a transmitting apparatus and/or receiving apparatus of the present specification.

FIG. 2 is a conceptual view illustrating the structure of a wireless local area network (WLAN).

FIG. 4 illustrates an example of a PPDU used in an IEEE standard.

FIG. 9 illustrates an example in which a plurality of user STAs are allocated to the same RU through a MU-MIMO scheme.

FIG. 10 illustrates an example of a PPDU used in the present specification.

FIG. 22 illustrates an embodiment related to RU allocation information.

FIG. 23 illustrates an embodiment related to RU allocation information.

FIG. 24 illustrates an embodiment related to an index of the null subcarrier.

FIG. 25 illustrates an embodiment related to all pilot subcarriers located at even-numbered indices.

FIG. 26 illustrates an embodiment related to all pilot subcarriers located at even-numbered indices.

FIG. 27 illustrates an embodiment related to a description for a modulation bit to which DCM is applied.

FIG. 28 illustrates an embodiment related to an LDPC tone mapping distance parameter for each bandwidth.

FIG. 29 illustrates an embodiment related to an equation for LDPC tone mapping for an LDPC-coded stream related to a user u.

FIG. 30 illustrates an embodiment related to an equation applied to BCC-coded stream.

FIG. 31 illustrates an embodiment related to LDPC tone mapping distance parameters for each of an RU size.

FIG. 32 illustrates an embodiment related to an equation for LDPC tone mapping for an LDPC-coded stream related to a user u.

FIG. 33 illustrates an embodiment related to an equation for LDPC tone mapping for the LDPC-encoded stream for the user u in the r-th RU.

FIG. 34 illustrates an embodiment related to an equation applied to the BCC coded stream.

FIG. 35 illustrates an embodiment related to an equation for LDPC tone mapping for an LDPC-encoded stream for user u in the r-th RU.

FIG. 36 illustrates an embodiment related to an equation for LDPC tone mapping for the LDPC-encoded stream for user u in the r-th RU.

DETAILED DESCRIPTION

Figure 3:
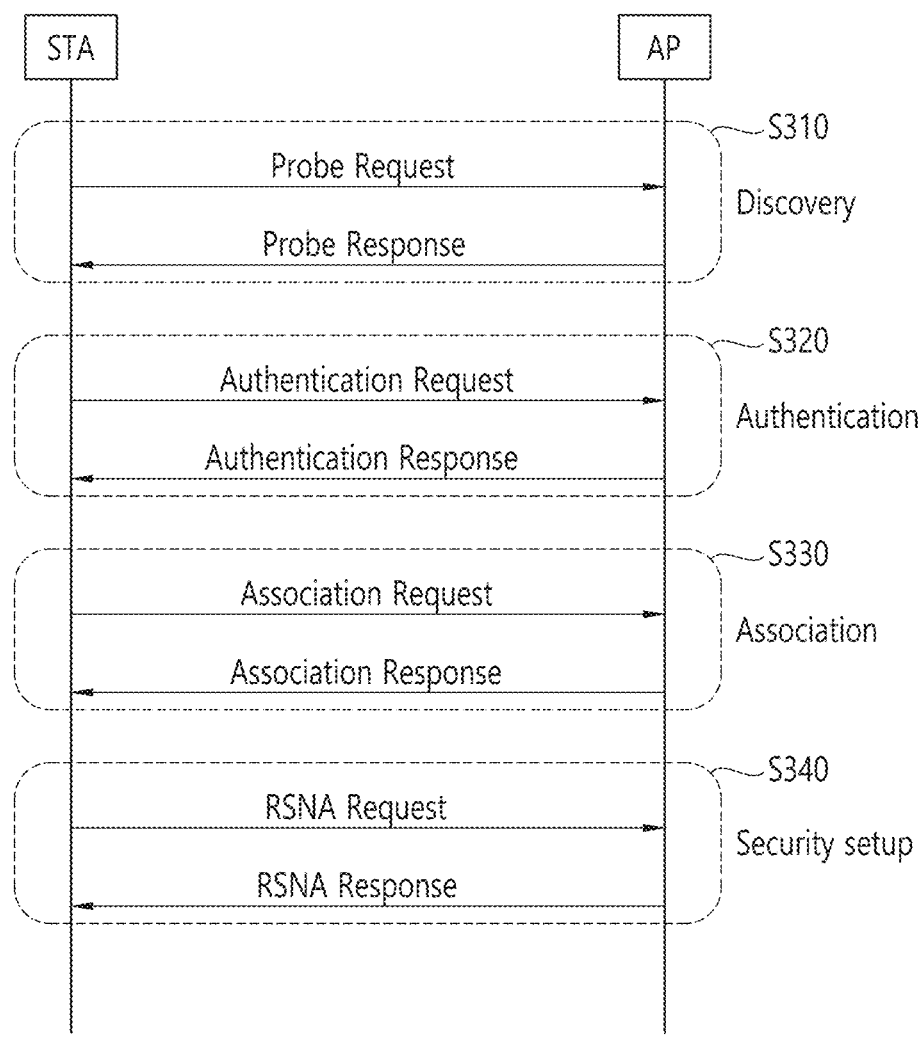
FIG. 3 illustrates a general link setup process.

In the present specification, "A or B" may mean "only A", "only B" or "both A and B". In other words, in the present specification, "A or B" may be interpreted as "A and/or B". For example, in the present specification, "A, B, or C" may mean "only A", "only B", "only C", or "any combination of A, B, C".

A slash (/) or comma used in the present specification may mean "and/or". For example, "A/B" may mean "A and/or B". Accordingly, "A/B" may mean "only A", "only B", or "both A and B". For example, "A, B, C" may mean "A, B, or C".

In the present specification, "at least one of A and B" may mean "only A", "only B", or "both A and B". In addition, in the present specification, the expression "at least one of A or B" or "at least one of A and/or B" may be interpreted as "at least one of A and B".

In addition, in the present specification, "at least one of A, B, and C" may mean "only A", "only B", "only C", or "any combination of A, B, and C". In addition, "at least one of A, B, or C" or "at least one of A, B, and/or C" may mean "at least one of A, B, and C".

In addition, a parenthesis used in the present specification may mean "for example". Specifically, when indicated as "control information (EHT-signal)", it may denote that "EHT-signal" is proposed as an example of the "control information". In other words, the "control information" of the present specification is not limited to "EHT-signal", and "EHT-signal" may be proposed as an example of the "control information". In addition, when indicated as "control information (i.e., EHT-signal)", it may also mean that "EHT-signal" is proposed as an example of the "control information".

Technical features described individually in one figure in the present specification may be individually implemented, or may be simultaneously implemented.

The following example of the present specification may be applied to various wireless communication systems. For example, the following example of the present specification may be applied to a wireless local area network (WLAN) system. For example, the present specification may be applied to the IEEE 802.11a/g/n/ac standard or the IEEE 802.11ax standard. In addition, the present specification may also be applied to the newly proposed EHT standard or IEEE 802.11be standard. In addition, the example of the present specification may also be applied to a new WLAN standard enhanced from the EHT standard or the IEEE 802.11be standard. In addition, the example of the present specification may be applied to a mobile communication system. For example, it may be applied to a mobile communication system based on long term evolution (LTE) depending on a $3^{rd}$ generation partnership project (3GPP) standard and based on evolution of the LTE. In addition, the example of the present specification may be applied to a communication system of a 5G NR standard based on the 3GPP standard.

Hereinafter, in order to describe a technical feature of the present specification, a technical feature applicable to the present specification will be described.

FIG. 1 shows an example of a transmitting apparatus and/or receiving apparatus of the present specification.

In the example of FIG. 1, various technical features described below may be performed. FIG. 1 relates to at least one station (STA). For example, STAs 110 and 120 of the present specification may also be called in various terms such as a mobile terminal, a wireless device, a wireless transmit/receive unit (WTRU), a user equipment (UE), a mobile station (MS), a mobile subscriber unit, or simply a user. The STAs 110 and 120 of the present specification may also be called in various terms such as a network, a base station, a node-B, an access point (AP), a repeater, a router, a relay, or the like. The STAs 110 and 120 of the present specification may also be referred to as various names such as a receiving apparatus, a transmitting apparatus, a receiving STA, a transmitting STA, a receiving device, a transmitting device, or the like.

For example, the STAs 110 and 120 may serve as an AP or a non-AP. That is, the STAs 110 and 120 of the present specification may serve as the AP and/or the non-AP.

The STAs 110 and 120 of the present specification may support various communication standards together in addition to the IEEE 802.11 standard. For example, a communication standard (e.g., LTE, LTE-A, 5G NR standard) or the like based on the 3GPP standard may be supported. In addition, the STA of the present specification may be implemented as various devices such as a mobile phone, a vehicle, a personal computer, or the like. In addition, the STA of the present specification may support communication for various communication services such as voice calls, video calls, data communication, and self-driving (autonomous-driving), or the like.

The STAs 110 and 120 of the present specification may include a medium access control (MAC) conforming to the IEEE 802.11 standard and a physical layer interface for a radio medium.

The STAs 110 and 120 will be described below with reference to a sub-figure (a) of FIG. 1.

The first STA 110 may include a processor 111, a memory 112, and a transceiver 113. The illustrated process, memory, and transceiver may be implemented individually as separate chips, or at least two blocks/functions may be implemented through a single chip.

The transceiver 113 of the first STA performs a signal transmission/reception operation. Specifically, an IEEE 802.11 packet (e.g., IEEE 802.11a/b/g/n/ac/ax/be, etc.) may be transmitted/received.

For example, the first STA 110 may perform an operation intended by an AP. For example, the processor 111 of the AP may receive a signal through the transceiver 113, process a reception (RX) signal, generate a transmission (TX) signal, and provide control for signal transmission. The memory 112 of the AP may store a signal (e.g., RX signal) received through the transceiver 113, and may store a signal (e.g., TX signal) to be transmitted through the transceiver.

For example, the second STA 120 may perform an operation intended by a non-AP STA. For example, a transceiver 123 of a non-AP performs a signal transmission/reception operation. Specifically, an IEEE 802.11 packet (e.g., IEEE 802.11a/b/g/n/ac/ax/be packet, etc.) may be transmitted/received.

For example, a processor 121 of the non-AP STA may receive a signal through the transceiver 123, process an RX signal, generate a TX signal, and provide control for signal transmission. A memory 122 of the non-AP STA may store a signal (e.g., RX signal) received through the transceiver 123, and may store a signal (e.g., TX signal) to be transmitted through the transceiver.

For example, an operation of a device indicated as an AP in the specification described below may be performed in the first STA 110 or the second STA 120. For example, if the first STA 110 is the AP, the operation of the device indicated as the AP may be controlled by the processor 111 of the first STA 110, and a related signal may be transmitted or received through the transceiver 113 controlled by the processor 111 of the first STA 110. In addition, control information related to the operation of the AP or a TX/RX signal of the AP may be stored in the memory 112 of the first STA 110. In addition, if the second STA 120 is the AP, the operation of the device indicated as the AP may be controlled by the processor 121 of the second STA 120, and a related signal may be transmitted or received through the transceiver 123 controlled by the processor 121 of the second STA 120. In addition, control information related to the operation of the AP or a TX/RX signal of the AP may be stored in the memory 122 of the second STA 120.

For example, in the specification described below, an operation of a device indicated as a non-AP (or user-STA) may be performed in the first STA 110 or the second STA 120. For example, if the second STA 120 is the non-AP, the operation of the device indicated as the non-AP may be controlled by the processor 121 of the second STA 120, and a related signal may be transmitted or received through the transceiver 123 controlled by the processor 121 of the second STA 120. In addition, control information related to the operation of the non-AP or a TX/RX signal of the non-AP may be stored in the memory 122 of the second STA 120. For example, if the first STA 110 is the non-AP, the operation of the device indicated as the non-AP may be controlled by the processor 111 of the first STA 110, and a related signal may be transmitted or received through the transceiver 113 controlled by the processor 111 of the first STA 110. In addition, control information related to the operation of the non-AP or a TX/RX signal of the non-AP may be stored in the memory 112 of the first STA 110.

In the specification described below, a device called a (transmitting/receiving) STA, a first STA, a second STA, a STA1, a STA2, an AP, a first AP, a second AP, an AP1, an AP2, a (transmitting/receiving) terminal, a (transmitting/receiving) device, a (transmitting/receiving) apparatus, a network, or the like may imply the STAs 110 and 120 of FIG. 1. For example, a device indicated as, without a specific reference numeral, the (transmitting/receiving) STA, the first STA, the second STA, the STA1, the STA2, the AP, the first AP, the second AP, the AP1, the AP2, the (transmitting/receiving) terminal, the (transmitting/receiving) device, the (transmitting/receiving) apparatus, the network, or the like may imply the STAs 110 and 120 of FIG. 1. For example, in the following example, an operation in which various STAs transmit/receive a signal (e.g., a PPDU) may be performed in the transceivers 113 and 123 of FIG. 1. In addition, in the following example, an operation in which various STAs generate a TX/RX signal or perform data processing and computation in advance for the TX/RX signal may be performed in the processors 111 and 121 of FIG. 1. For example, an example of an operation for generating the TX/RX signal or performing the data processing and computation in advance may include: 1) an operation of determining/obtaining/configuring/computing/decoding/encoding bit information of a sub-field (SIG, STF, LTF, Data) included in a PPDU; 2) an operation of determining/configuring/obtaining a time resource or frequency resource (e.g., a subcarrier resource) or the like used for the sub-field (SIG, STF, LTF, Data) included the PPDU; 3) an operation of determining/configuring/obtaining a specific sequence (e.g., a pilot sequence, an STF/LTF sequence, an extra sequence applied to SIG) or the like used for the sub-field (SIG, STF, LTF, Data) field included in the PPDU; 4) a power control operation and/or power saving operation applied the for and STA; 5) an operation related to determining/obtaining/configuring/decoding/encoding or the like of an ACK signal. In addition, in the following example, a variety of information used by various STAs for determining/obtaining/configuring/computing/decoding/decoding a TX/RX signal (e.g., information related to a field/subfield/control field/parameter/power or the like) may be stored in the memories 112 and 122 of FIG. 1.

The aforementioned device/STA of the sub-figure (a) of FIG. 1 may be modified as shown in the sub-figure (b) of FIG. 1. Hereinafter, the STAs 110 and 120 of the present specification will be described based on the sub-figure (b) of FIG. 1.

For example, the transceivers 113 and 123 illustrated in the sub-figure (b) of FIG. 1 may perform the same function as the aforementioned transceiver illustrated in the sub-figure (a) of FIG. 1. For example, processing chips 114 and 124 illustrated in the sub-figure (b) of FIG. 1 may include the processors 111 and 121 and the memories 112 and 122. The processors 111 and 121 and memories 112 and 122 illustrated in the sub-figure (b) of FIG. 1 may perform the same function as the aforementioned processors 111 and 121 and memories 112 and 122 illustrated in the sub-figure (a) of FIG. 1.

A mobile terminal, a wireless device, a wireless transmit/ receive unit (WTRU), a user equipment (UE), a mobile station (MS), a mobile subscriber unit, a user, a user STA, a network, a base station, a Node-B, an access point (AP), a repeater, a router, a relay, a receiving unit, a transmitting unit, a receiving STA, a transmitting STA, a receiving device, a transmitting device, a receiving apparatus, and/or a transmitting apparatus, which are described below, may imply the STAs 110 and 120 illustrated in the sub-figure (a)/(b) of FIG. 1, or may imply the processing chips 114 and 124 illustrated in the sub-figure (b) of FIG. 1. That is, a technical feature of the present specification may be performed in the STAs 110 and 120 illustrated in the sub-figure (a)/(b) of FIG. 1, or may be performed only in the processing chips 114 and 124 illustrated in the sub-figure (b) of FIG. 1. For example, a technical feature in which the transmitting STA transmits a control signal may be understood as a technical feature in which a control signal generated in the processors 111 and 121 illustrated in the sub-figure (a)/(b) of FIG. 1 is transmitted through the transceivers 113 and 123 illustrated in the sub-figure (a)/(b) of FIG. 1. Alternatively, the technical feature in which the transmitting STA transmits the control signal may be understood as a technical feature in which the control signal to be transferred to the transceivers 113 and 123 is generated in the processing chips 114 and 124 illustrated in the sub-figure (b) of FIG. 1.

For example, a technical feature in which the receiving STA receives the control signal may be understood as a technical feature in which the control signal is received by means of the transceivers 113 and 123 illustrated in the sub-figure (a) of FIG. 1. Alternatively, the technical feature in which the receiving STA receives the control signal may be understood as the technical feature in which the control signal received in the transceivers 113 and 123 illustrated in the sub-figure (a) of FIG. 1 is obtained by the processors 111 and 121 illustrated in the sub-figure (a) of FIG. 1. Alternatively, the technical feature in which the receiving STA receives the control signal may be understood as the technical feature in which the control signal received in the transceivers 113 and 123 illustrated in the sub-figure (b) of FIG. 1 is obtained by the processing chips 114 and 124 illustrated in the sub-figure (b) of FIG. 1.

Referring to the sub-figure (b) of FIG. 1, software codes 115 and 125 may be included in the memories 112 and 122. The software codes 115 and 126 may include instructions for controlling an operation of the processors 111 and 121. The software codes 115 and 125 may be included as various programming languages.

The processors 111 and 121 or processing chips 114 and 124 of FIG. 1 may include an application-specific integrated circuit (ASIC), other chipsets, a logic circuit and/or a data processing device. The processor may be an application processor (AP). For example, the processors 111 and 121 or processing chips 114 and 124 of FIG. 1 may include at least one of a digital signal processor (DSP), a central processing unit (CPU), a graphics processing unit (GPU), and a modulator and demodulator (modem). For example, the processors 111 and 121 or processing chips 114 and 124 of FIG. 1 may be SNAPDRAGON™ series of processors made by Qualcomm®, EXYNOS™ series of processors made by Samsung®, A series of processors made by Apple®, HELIO™ series of processors made by MediaTek®, ATOM™ series of processors made by Intel® or processors enhanced from these processors.

In the present specification, an uplink may imply a link for communication from a non-AP STA to an SP STA, and an uplink PPDU/packet/signal or the like may be transmitted through the uplink. In addition, in the present specification, a downlink may imply a link for communication from the AP STA to the non-AP STA, and a downlink PPDU/packet/ signal or the like may be transmitted through the downlink.

FIG. 2 is a conceptual view illustrating the structure of a wireless local area network (WLAN).

An upper part of FIG. 2 illustrates the structure of an infrastructure basic service set (BSS) of institute of electrical and electronic engineers (IEEE) 802.11.

Referring the upper part of FIG. 2, the wireless LAN system may include one or more infrastructure BSSs 200 and 205 (hereinafter, referred to as BSS). The BSSs 200 and 205 as a set of an AP and a STA such as an access point (AP) 225 and a station (STA1) 200-1 which are successfully synchronized to communicate with each other are not concepts indicating a specific region. The BSS 205 may include one or more STAs 205-1 and 205-2 which may be joined to one AP 230.

The BSS may include at least one STA, APs providing a distribution service, and a distribution system (DS) 210 connecting multiple APs.

The distribution system 210 may implement an extended service set (ESS) 240 extended by connecting the multiple BSSs 200 and 205. The ESS 240 may be used as a term indicating one network configured by connecting one or more APs 225 or 230 through the distribution system 210. The AP included in one ESS 240 may have the same service set identification (SSID).

A portal 220 may serve as a bridge which connects the wireless LAN network (IEEE 802.11) and another network (e.g., 802.X).

In the BSS illustrated in the upper part of FIG. 2, a network between the APs 225 and 230 and a network between the APs 225 and 230 and the STAs 200-1, 205-1, and 205-2 may be implemented. However, the network is configured even between the STAs without the APs 225 and 230 to perform communication. A network in which the communication is performed by configuring the network even between the STAs without the APs 225 and 230 is defined as an Ad-Hoc network or an independent basic service set (IBSS).

A lower part of FIG. 2 illustrates a conceptual view illustrating the IBSS.

Referring to the lower part of FIG. 2, the IBSS is a BSS that operates in an Ad-Hoc mode. Since the IBSS does not include the access point (AP), a centralized management entity that performs a management function at the center does not exist. That is, in the IBSS, STAs 250-1, 250-2, 250-3, 255-4, and 255-5 are managed by a distributed manner. In the IBSS, all STAs 250-1, 250-2, 250-3, 255-4, and 255-5 may be constituted by movable STAs and are not permitted to access the DS to constitute a self-contained network.

FIG. 3 illustrates a general link setup process.

In S310, a STA may perform a network discovery operation. The network discovery operation may include a scanning operation of the STA. That is, to access a network, the STA needs to discover a participating network. The STA needs to identify a compatible network before participating in a wireless network, and a process of identifying a network present in a particular area is referred to as scanning. Scanning methods include active scanning and passive scanning.

FIG. 3 illustrates a network discovery operation including an active scanning process. In active scanning, a STA performing scanning transmits a probe request frame and waits for a response to the probe request frame in order to identify which AP is present around while moving to channels. A responder transmits a probe response frame as a response to the probe request frame to the STA having transmitted the probe request frame. Here, the responder may be a STA that transmits the last beacon frame in a BSS of a channel being scanned. In the BSS, since an AP transmits a beacon frame, the AP is the responder. In an IBSS, since STAs in the IBSS transmit a beacon frame in turns, the responder is not fixed. For example, when the STA transmits a probe request frame via channel 1 and receives a probe response frame via channel 1, the STA may store BSS-related information included in the received probe response frame, may move to the next channel (e.g., channel 2), and may perform scanning (e.g., transmits a probe request and receives a probe response via channel 2) by the same method.

Although not shown in FIG. 3, scanning may be performed by a passive scanning method. In passive scanning, a STA performing scanning may wait for a beacon frame while moving to channels. A beacon frame is one of management frames in IEEE 802.11 and is periodically transmitted to indicate the presence of a wireless network and to enable the STA performing scanning to find the wireless network and to participate in the wireless network. In a BSS, an AP serves to periodically transmit a beacon frame. In an IBSS, STAs in the IBSS transmit a beacon frame in turns. Upon receiving the beacon frame, the STA performing scanning stores information related to a BSS included in the beacon frame and records beacon frame information in each channel while moving to another channel. The STA having received the beacon frame may store BSS-related information included in the received beacon frame, may move to the next channel, and may perform scanning in the next channel by the same method.

After discovering the network, the STA may perform an authentication process in S320. The authentication process may be referred to as a first authentication process to be clearly distinguished from the following security setup operation in S340. The authentication process in S320 may include a process in which the STA transmits an authentication request frame to the AP and the AP transmits an authentication response frame to the STA in response. The authentication frames used for an authentication request/response are management frames.

The authentication frames may include information related to an authentication algorithm number, an authentication transaction sequence number, a status code, a challenge text, a robust security network (RSN), and a finite cyclic group.

The STA may transmit the authentication request frame to the AP. The AP may determine whether to allow the authentication of the STA based on the information included in the received authentication request frame. The AP may provide the authentication processing result to the STA via the authentication response frame.

When the STA is successfully authenticated, the STA may perform an association process in S330. The association process includes a process in which the STA transmits an association request frame to the AP and the AP transmits an association response frame to the STA in response. The association request frame may include, for example, information related to various capabilities, a beacon listen interval, a service set identifier (SSID), a supported rate, a supported channel, RSN, a mobility domain, a supported operating class, a traffic indication map (TIM) broadcast request, and an interworking service capability. The association response frame may include, for example, information related to various capabilities, a status code, an association ID (AID), a supported rate, an enhanced distributed channel access (EDCA) parameter set, a received channel power indicator (RCPI), a received signal-to-noise indicator (RSNI), a mobility domain, a timeout interval (association comeback time), an overlapping BSS scanning parameter, a TIM broadcast response, and a QoS map.

In S340, the STA may perform a security setup process. The security setup process in S340 may include a process of setting up a private key through four-way handshaking, for example, through an extensible authentication protocol over LAN (EAPOL) frame.

FIG. 4 illustrates an example of a PPDU used in an IEEE standard.

As illustrated, various types of PHY protocol data units (PPDUs) are used in IEEE a/g/n/ac standards. Specifically, an LTF and a STF include a training signal, a SIG-A and a SIG-B include control information for a receiving STA, and a data field includes user data corresponding to a PSDU (MAC PDU/aggregated MAC PDU).

FIG. 4 also includes an example of an HE PPDU according to IEEE 802.11ax. The HE PPDU according to FIG. 4 is an illustrative PPDU for multiple users. An HE-SIG-B may be included only in a PPDU for multiple users, and an HE-SIG-B may be omitted in a PPDU for a single user.

As illustrated in FIG. 4, the HE-PPDU for multiple users (MUs) may include a legacy-short training field (L-STF), a legacy-long training field (L-LTF), a legacy-signal (L-SIG), a high efficiency-signal A (HE-SIG A), a high efficiency-signal-B (HE-SIG B), a high efficiency-short training field (HE-STF), a high efficiency-long training field (HE-LTF), a data field (alternatively, an MAC payload), and a packet extension (PE) field. The respective fields may be transmitted for illustrated time periods (i.e., 4 or 8 μs).

Hereinafter, a resource unit (RU) used for a PPDU is described. An RU may include a plurality of subcarriers (or tones). An RU may be used to transmit a signal to a plurality of STAs according to OFDMA. Further, an RU may also be defined to transmit a signal to one STA. An RU may be used for an STF, an LTF, a data field, or the like.

Figure 5:
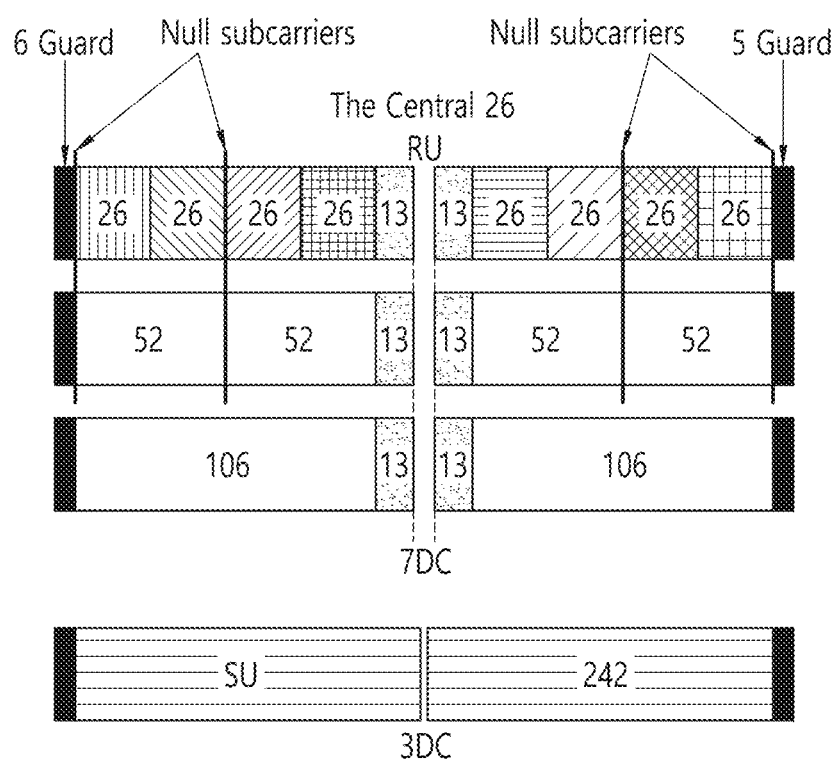
FIG. 5 illustrates a layout of resource units (RUs) used in a band of 20 MHz.

FIG. 5 illustrates a layout of resource units (RUs) used in a band of 20 MHz.

As illustrated in FIG. 5, resource units (RUs) corresponding to different numbers of tones (i.e., subcarriers) may be used to form some fields of an HE-PPDU. For example, resources may be allocated in illustrated RUs for an HE-STF, an HE-LTF, and a data field.

As illustrated in the uppermost part of FIG. 5, a 26-unit (i.e., a unit corresponding to 26 tones) may be disposed. Six tones may be used for a guard band in the leftmost band of the 20 MHz band, and five tones may be used for a guard band in the rightmost band of the 20 MHz band. Further, seven DC tones may be inserted in a center band, that is, a DC band, and a 26-unit corresponding to 13 tones on each of the left and right sides of the DC band may be disposed. A 26-unit, a 52-unit, and a 106-unit may be allocated to other bands. Each unit may be allocated for a receiving STA, that is, a user.

The layout of the RUs in FIG. 5 may be used not only for a multiple users (MUs) but also for a single user (SU), in which case one 242-unit may be used and three DC tones may be inserted as illustrated in the lowermost part of FIG. 5.

Although FIG. 5 proposes RUs having various sizes, that is, a 26-RU, a 52-RU, a 106-RU, and a 242-RU, specific sizes of RUs may be extended or increased. Therefore, the present embodiment is not limited to the specific size of each RU (i.e., the number of corresponding tones).

Figure 6:
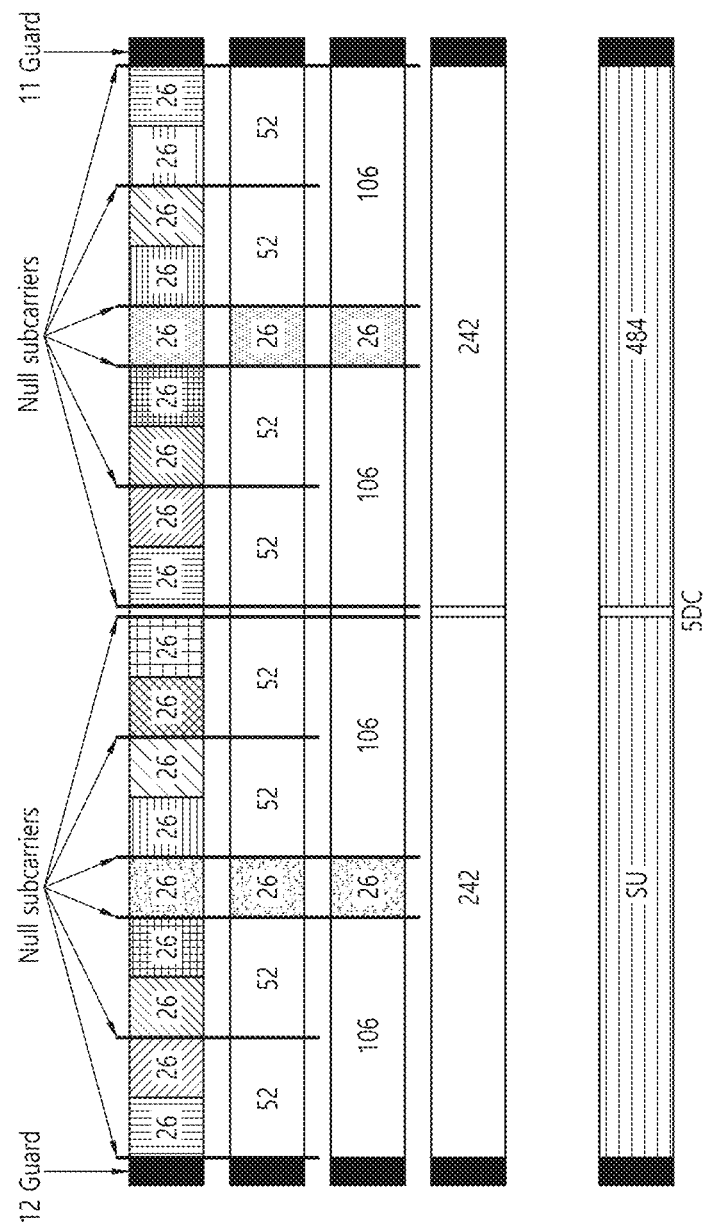
FIG. 6 illustrates a layout of RUs used in a band of 40 MHz.

FIG. 6 illustrates a layout of RUs used in a band of 40 MHz.

Similarly to FIG. 5 in which RUs having various sizes are used, a 26-RU, a 52-RU, a 106-RU, a 242-RU, a 484-RU, and the like may be used in an example of FIG. 6. Further, five DC tones may be inserted in a center frequency, 12 tones may be used for a guard band in the leftmost band of the 40 MHz band, and 11 tones may be used for a guard band in the rightmost band of the 40 MHz band.

As illustrated in FIG. 6, when the layout of the RUs is used for a single user, a 484-RU may be used. The specific number of RUs may be changed similarly to FIG. 5.

Figure 7:
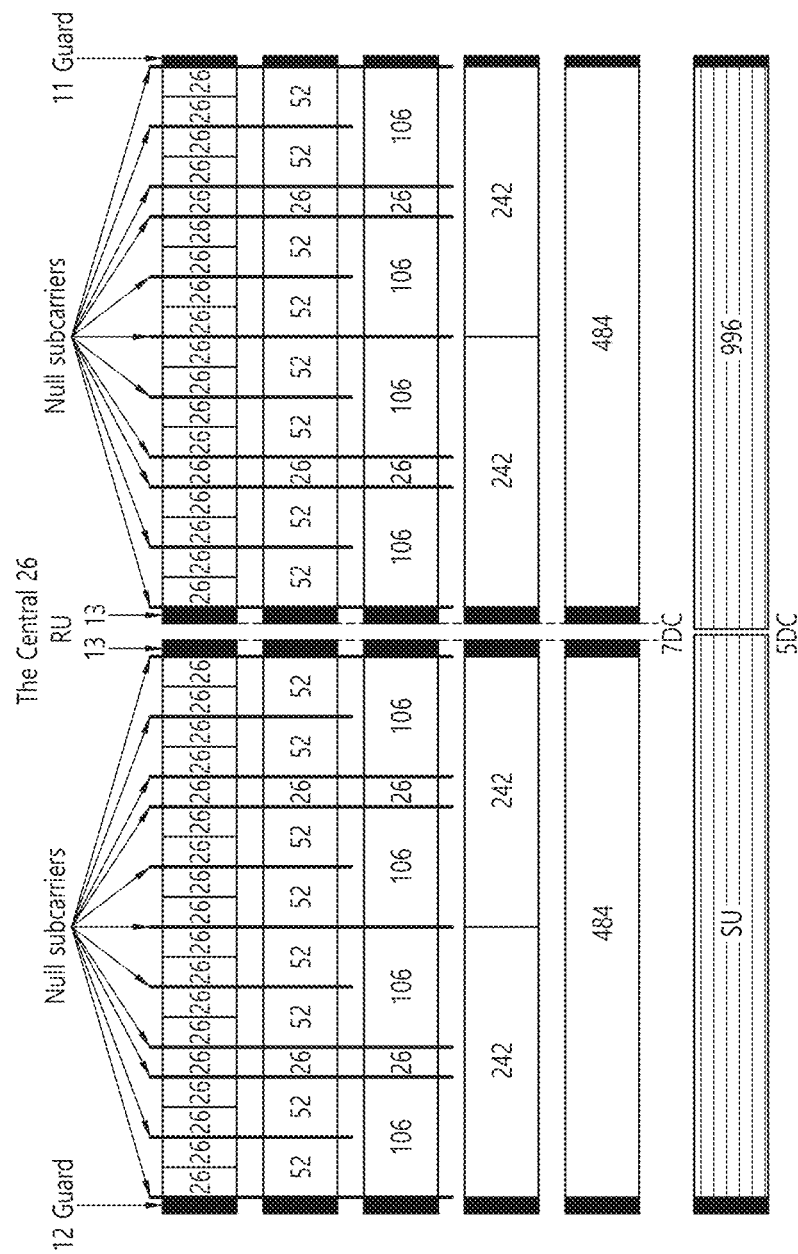
FIG. 7 illustrates a layout of RUs used in a band of 80 MHz.

FIG. 7 illustrates a layout of RUs used in a band of 80 MHz.

Similarly to FIG. 5 and FIG. 6 in which RUs having various sizes are used, a 26-RU, a 52-RU, a 106-RU, a 242-RU, a 484-RU, a 996-RU, and the like may be used in an example of FIG. 7. Further, seven DC tones may be inserted in the center frequency, 12 tones may be used for a guard band in the leftmost band of the 80 MHz band, and 11 tones may be used for a guard band in the rightmost band of the 80 MHz band. In addition, a 26-RU corresponding to 13 tones on each of the left and right sides of the DC band may be used.

As illustrated in FIG. 7, when the layout of the RUs is used for a single user, a 996-RU may be used, in which case five DC tones may be inserted.

The RU described in the present specification may be used in uplink (UL) communication and downlink (DL) communication. For example, when UL-MU communication which is solicited by a trigger frame is performed, a transmitting STA (e.g., an AP) may allocate a first RU (e.g., 26/52/106/242-RU, etc.) to a first STA through the trigger frame, and may allocate a second RU (e.g., 26/52/106/242-RU, etc.) to a second STA. Thereafter, the first STA may transmit a first trigger-based PPDU based on the first RU, and the second STA may transmit a second trigger-based PPDU based on the second RU. The first/second trigger-based PPDU is transmitted to the AP at the same (or overlapped) time period.

For example, when a DL MU PPDU is configured, the transmitting STA (e.g., AP) may allocate the first RU (e.g., 26/52/106/242-RU, etc.) to the first STA, and may allocate the second RU (e.g., 26/52/106/242-RU, etc.) to the second STA. That is, the transmitting STA (e.g., AP) may transmit HE-STF, HE-LTF, and Data fields for the first STA through the first RU in one MU PPDU, and may transmit HE-STF, HE-LTF, and Data fields for the second STA through the second RU.

Information related to a layout of the RU may be signaled through HE-SIG-B.

Figure 8:
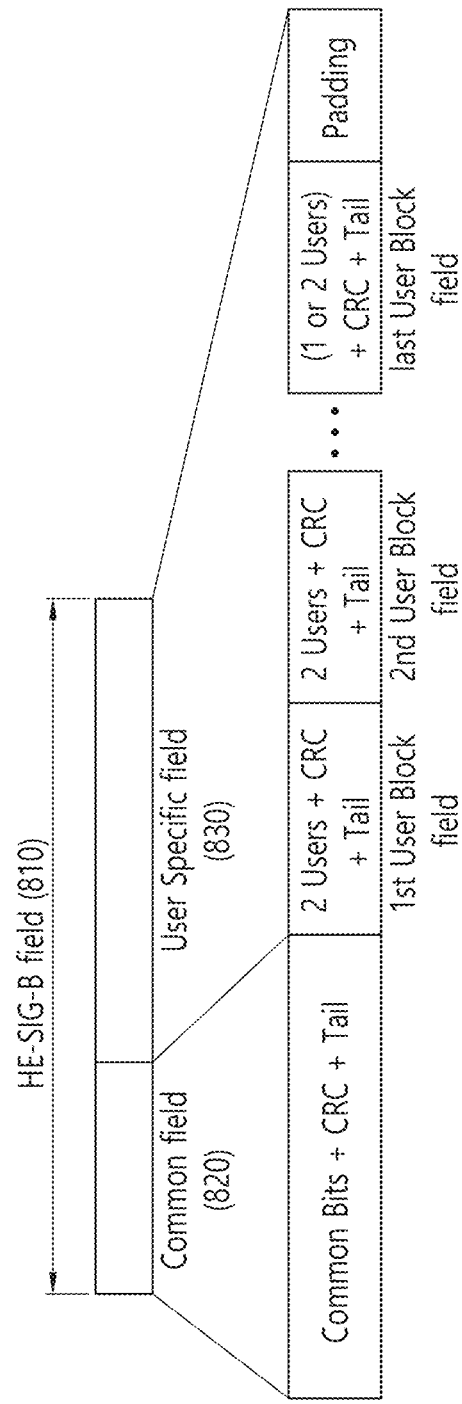
FIG. 8 illustrates a structure of an HE-SIG-B field.

FIG. 8 illustrates a structure of an HE-SIG-B field.

As illustrated, an HE-SIG-B field 810 includes a common field 820 and a user-specific field 830. The common field 820 may include information commonly applied to all users (i.e., user STAs) which receive SIG-B. The user-specific field 830 may be called a user-specific control field. When the SIG-B is transferred to a plurality of users, the user-specific field 830 may be applied only any one of the plurality of users.

As illustrated in FIG. 8, the common field 820 and the user-specific field 830 may be separately encoded.

The common field 820 may include RU allocation information of N*8 bits. For example, the RU allocation information may include information related to a location of an RU. For example, when a 20 MHz channel is used as shown in FIG. 5, the RU allocation information may include information related to a specific frequency band to which a specific RU (26-RU/52-RU/106-RU) is arranged.

An example of a case in which the RU allocation information consists of 8 bits is as in FIG. 22.

As shown the example of FIG. 5, up to nine 26-RUs may be allocated to the 20 MHZ channel. When the RU allocation information of the common field 820 is set to "00000000" as shown in FIG. 22, the nine 26-RUs may be allocated to a corresponding channel (i.e., 20 MHz). In addition, when the RU allocation information of the common field 820 is set to "00000001" as shown in FIG. 22, seven 26-RUs and one 52-RU are arranged in a corresponding channel. That is, in the example of FIG. 5, the 52-RU may be allocated to the rightmost side, and the seven 26-RUs may be allocated to the left thereof.

The example of FIG. 22 shows only some of RU locations capable of displaying the RU allocation information.

For example, the RU allocation information may include an example of FIG. 23.

"01000y2y1y0" relates to an example in which a 106-RU is allocated to the leftmost side of the 20 MHz channel, and five 26-RUs are allocated to the right side thereof. In this case, a plurality of STAs (e.g., user-STAs) may be allocated to the 106-RU, based on a MU-MIMO scheme. Specifically, up to 8 STAs (e.g., user-STAs) may be allocated to the 106-RU, and the number of STAs (e.g., user-STAs) allocated to the 106-RU is determined based on 3-bit information (y2y1y0). For example, when the 3-bit information (y2y1y0) is set to N, the number of STAs (e.g., user-STAs) allocated to the 106-RU based on the MU-MIMO scheme may be N+1.

In general, a plurality of STAs (e.g., user STAs) different from each other may be allocated to a plurality of RUs. However, the plurality of STAs (e.g., user STAs) may be allocated to one or more RUs having at least a specific size (e.g., 106 subcarriers), based on the MU-MIMO scheme.

As shown in FIG. 8, the user-specific field 830 may include a plurality of user fields. As described above, the number of STAs (e.g., user STAs) allocated to a specific channel may be determined based on the RU allocation information of the common field 820. For example, when the RU allocation information of the common field 820 is "00000000", one user STA may be allocated to each of nine 26-RUs (e.g., nine user STAs may be allocated). That is, up to 9 user STAs may be allocated to a specific channel through an OFDMA scheme. In other words, up to 9 user STAs may be allocated to a specific channel through a non-MU-MIMO scheme.

For example, when RU allocation is set to "01000y2y1y0", a plurality of STAs may be allocated to the 106-RU arranged at the leftmost side through the MU-MIMO scheme, and five user STAs may be allocated to five 26-RUs arranged to the right side thereof through the non-MU MIMO scheme. This case is specified through an example of FIG. 9.

FIG. 9 illustrates an example in which a plurality of user STAs are allocated to the same RU through a MU-MIMO scheme.

For example, when RU allocation is set to "01000010" as shown in FIG. 9, a 106-RU may be allocated to the leftmost side of a specific channel, and five 26-RUs may be allocated to the right side thereof. In addition, three user STAs may be allocated to the 106-RU through the MU-MIMO scheme. As a result, since eight user STAs are allocated, the user-specific field 830 of HE-SIG-B may include eight user fields.

The eight user fields may be expressed in the order shown in FIG. 9. In addition, as shown in FIG. 8, two user fields may be implemented with one user block field.

The user fields shown in FIG. 8 and FIG. 9 may be configured based on two formats. That is, a user field related to a MU-MIMO scheme may be configured in a first format, and a user field related to a non-MIMO scheme may be configured in a second format. Referring to the example of FIG. 9, a user field 1 to a user field 3 may be based on the first format, and a user field 4 to a user field 8 may be based on the second format. The first format or the second format may include bit information of the same length (e.g., 21 bits).

Each user field may have the same size (e.g., 21 bits). For example, the user field of the first format (the first of the MU-MIMO scheme) may be configured as follows.

For example, a first bit (i.e., B0-B10) in the user field (i.e., 21 bits) may include identification information (e.g., STA-ID, partial AID, etc.) of a user STA to which a corresponding user field is allocated. In addition, a second bit (i.e., B11-B14) in the user field (i.e., 21 bits) may include information related to a spatial configuration.

In addition, a third bit (i.e., B15-18) in the user field (i.e., 21 bits) may include modulation and coding scheme (MCS) information. The MCS information may be applied to a data field in a PPDU including corresponding SIG-B.

An MCS, MCS information, an MCS index, an MCS field, or the like used in the present specification may be indicated by an index value. For example, the MCS information may be indicated by an index 0 to an index 11. The MCS information may include information related to a constellation modulation type (e.g., BPSK, QPSK, 16-QAM, 64-QAM, 256-QAM, 1024-QAM, etc.) and information related to a coding rate (e.g., 1/2, 2/3, 3/4, 5/6e, etc.). Information related to a channel coding type (e.g., LCC or LDPC) may be excluded in the MCS information.

In addition, a fourth bit (i.e., B19) in the user field (i.e., 21 bits) may be a reserved field.

In addition, a fifth bit (i.e., B20) in the user field (i.e., 21 bits) may include information related to a coding type (e.g., BCC or LDPC). That is, the fifth bit (i.e., B20) may include information related to a type (e.g., BCC or LDPC) of channel coding applied to the data field in the PPDU including the corresponding SIG-B.

The aforementioned example relates to the user field of the first format (the format of the MU-MIMO scheme). An example of the user field of the second format (the format of the non-MU-MIMO scheme) is as follows.

A first bit (e.g., B0-B10) in the user field of the second format may include identification information of a user STA. In addition, a second bit (e.g., B11-B13) in the user field of the second format may include information related to the number of spatial streams applied to a corresponding RU. In addition, a third bit (e.g., B14) in the user field of the second format may include information related to whether a beamforming steering matrix is applied. A fourth bit (e.g., B15-B18) in the user field of the second format may include modulation and coding scheme (MCS) information. In addition, a fifth bit (e.g., B19) in the user field of the second format may include information related to whether dual carrier modulation (DCM) is applied. In addition, a sixth bit (i.e., B20) in the user field of the second format may include information related to a coding type (e.g., BCC or LDPC).

Hereinafter, a PPDU transmitted/received in a STA of the present specification will be described.

FIG. 10 illustrates an example of a PPDU used in the present specification.

The PPDU of FIG. 10 may be called in various terms such as an EHT PPDU, a TX PPDU, an RX PPDU, a first type or N-th type PPDU, or the like. For example, in the present specification, the PPDU or the EHT PPDU may be called in various terms such as a TX PPDU, a RX PPDU, a first type or N-th type PPDU, or the like. In addition, the EHT PPDU may be used in an EHT system and/or a new WLAN system enhanced from the EHT system.

The PPDU of FIG. 10 may indicate the entirety or part of a PPDU type used in the EHT system. For example, the example of FIG. 10 may be used for both of a single-user (SU) mode and a multi-user (MU) mode. In other words, the PPDU of FIG. 10 may be a PPDU for one receiving STA or a plurality of receiving STAs. When the PPDU of FIG. 10 is used for a trigger-based (TB) mode, the EHT-SIG of FIG. 10 may be omitted. In other words, an STA which has received a trigger frame for uplink-MU (UL-MU) may transmit the PPDU in which the EHT-SIG is omitted in the example of FIG. 10.

In FIG. 10, an L-STF to an EHT-LTF may be called a preamble or a physical preamble, and may be generated/transmitted/received/obtained/decoded in a physical layer.

A subcarrier spacing of the L-STF, L-LTF, L-SIG, RL-SIG, U-SIG, and EHT-SIG fields of FIG. 10 may be determined as 312.5 kHz, and a subcarrier spacing of the EHT-STF, EHT-LTF, and Data fields may be determined as 78.125 kHz. That is, a tone index (or subcarrier index) of the L-STF, L-LTF, L-SIG, RL-SIG, U-SIG, and EHT-SIG fields may be expressed in unit of 312.5 kHz, and a tone index (or subcarrier index) of the EHT-STF, EHT-LTF, and Data fields may be expressed in unit of 78.125 kHz.

In the PPDU of FIG. 10, the L-LTE and the L-STF may be the same as those in the conventional fields.

The L-SIG field of FIG. 10 may include, for example, bit information of 24 bits. For example, the 24-bit information may include a rate field of 4 bits, a reserved bit of 1 bit, a length field of 12 bits, a parity bit of 1 bit, and a tail bit of 6 bits. For example, the length field of 12 bits may include information related to a length or time duration of a PPDU. For example, the length field of 12 bits may be determined based on a type of the PPDU. For example, when the PPDU is a non-HT, HT, VHT PPDU or an EHT PPDU, a value of the length field may be determined as a multiple of 3. For example, when the PPDU is an HE PPDU, the value of the length field may be determined as "a multiple of 3"+1 or "a multiple of 3"+2. In other words, for the non-HT, HT, VHT PPDI or the EHT PPDU, the value of the length field may be determined as a multiple of 3, and for the HE PPDU, the value of the length field may be determined as "a multiple of 3"+1 or "a multiple of 3"+2.

For example, the transmitting STA may apply BCC encoding based on a 1/2 coding rate to the 24-bit information of the L-SIG field. Thereafter, the transmitting STA may obtain a BCC coding bit of 48 bits. BPSK modulation may be applied to the 48-bit coding bit, thereby generating 48 BPSK symbols. The transmitting STA may map the 48 BPSK symbols to positions except for a pilot subcarrier {subcarrier index −21, −7, +7, +21} and a DC subcarrier {subcarrier index 0}. As a result, the 48 BPSK symbols may be mapped to subcarrier indices −26 to −22, −20 to −8, −6 to −1, +1 to +6, +8 to +20, and +22 to +26. The transmitting STA may additionally map a signal of {−1, −1, −1, 1} to a subcarrier index {−28, −27, +27, +28}. The aforementioned signal may be used for channel estimation on a frequency domain corresponding to {−28, −27, +27, +28}.

The transmitting STA may generate an RL-SIG generated in the same manner as the L-SIG. BPSK modulation may be applied to the RL-SIG. The receiving STA may know that the RX PPDU is the HE PPDU or the EHT PPDU, based on the presence of the RL-SIG.

A universal SIG (U-SIG) may be inserted after the RL-SIG of FIG. 10. The U-SIB may be called in various terms such as a first SIG field, a first SIG, a first type SIG, a control signal, a control signal field, a first (type) control signal, or the like.

The U-SIG may include information of N bits, and may include information for identifying a type of the EHT PPDU. For example, the U-SIG may be configured based on two symbols (e.g., two contiguous OFDM symbols). Each symbol (e.g., OFDM symbol) for the U-SIG may have a duration of 4 μs. Each symbol of the U-SIG may be used to transmit the 26-bit information. For example, each symbol of the U-SIG may be transmitted/received based on 52 data tomes and 4 pilot tones.

Through the U-SIG (or U-SIG field), for example, A-bit information (e.g., 52 un-coded bits) may be transmitted. A first symbol of the U-SIG may transmit first X-bit information (e.g., 26 un-coded bits) of the A-bit information, and a second symbol of the U-SIB may transmit the remaining Y-bit information (e.g. 26 un-coded bits) of the A-bit information. For example, the transmitting STA may obtain 26 un-coded bits included in each U-SIG symbol. The transmitting STA may perform convolutional encoding (i.e., BCC encoding) based on a rate of R=1/2 to generate 52-coded bits, and may perform interleaving on the 52-coded bits. The transmitting STA may perform BPSK modulation on the interleaved 52-coded bits to generate 52 BPSK symbols to be allocated to each U-SIG symbol. One U-SIG symbol may be transmitted based on 65 tones (subcarriers) from a subcarrier index −28 to a subcarrier index +28, except for a DC index 0. The 52 BPSK symbols generated by the transmitting STA may be transmitted based on the remaining tones (subcarriers) except for pilot tones, i.e., tones −21, −7, +7, +21.

For example, the A-bit information (e.g., 52 un-coded bits) generated by the U-SIG may include a CRC field (e.g., a field having a length of 4 bits) and a tail field (e.g., a field having a length of 6 bits). The CRC field and the tail field may be transmitted through the second symbol of the U-SIG. The CRC field may be generated based on 26 bits allocated to the first symbol of the U-SIG and the remaining 16 bits except for the CRC/tail fields in the second symbol, and may be generated based on the conventional CRC calculation algorithm. In addition, the tail field may be used to terminate trellis of a convolutional decoder, and may be set to, for example, "000000".

The A-bit information (e.g., 52 un-coded bits) transmitted by the U-SIG (or U-SIG field) may be divided into version-independent bits and version-dependent bits. For example, the version-independent bits may have a fixed or variable size. For example, the version-independent bits may be allocated only to the first symbol of the U-SIG, or the version-independent bits may be allocated to both of the first and second symbols of the U-SIG. For example, the version-independent bits and the version-dependent bits may be called in various terms such as a first control bit, a second control bit, or the like.

For example, the version-independent bits of the U-SIG may include a PHY version identifier of 3 bits. For example, the PHY version identifier of 3 bits may include information related to a PHY version of a TX/RX PPDU. For example, a first value of the PHY version identifier of 3 bits may indicate that the TX/RX PPDU is an EHT PPDU. In other words, when the transmitting STA transmits the EHT PPDU, the PHY version identifier of 3 bits may be set to a first value. In other words, the receiving STA may determine that the RX PPDU is the EHT PPDU, based on the PHY version identifier having the first value.

For example, the version-independent bits of the U-SIG may include a UL/DL flag field of 1 bit. A first value of the UL/DL flag field of 1 bit relates to UL communication, and a second value of the UL/DL flag field relates to DL communication.

For example, the version-independent bits of the U-SIG may include information related to a TXOP length and information related to a BSS color ID.

For example, when the EHT PPDU is divided into various types (e.g., various types such as an EHT PPDU related to an SU mode, an EHT PPDU related to a MU mode, an EHT PPDU related to a TB mode, an EHT PPDU related to extended range transmission, or the like), information related to the type of the EHT PPDU may be included in the version-dependent bits of the U-SIG.

For example, the U-SIG may include: 1) a bandwidth field including information related to a bandwidth; 2) a field including information related to an MCS scheme applied to EHT-SIG; 3) an indication field including information regarding whether a dual subcarrier modulation (DCM) scheme is applied to EHT-SIG; 4) a field including information related to the number of symbol used for EHT-SIG; 5) a field including information regarding whether the EHT-SIG is generated across a full band; 6) a field including information related to a type of EHT-LTF/STF; and 7) information related to a field indicating an EHT-LTF length and a CP length.

Preamble puncturing may be applied to the PPDU of FIG. 10. The preamble puncturing implies that puncturing is applied to part (e.g., a secondary 20 MHz band) of the full band. For example, when an 80 MHz PPDU is transmitted, an STA may apply puncturing to the secondary 20 MHz band out of the 80 MHz band, and may transmit a PPDU only through a primary 20 MHz band and a secondary 40 MHz band.

For example, a pattern of the preamble puncturing may be configured in advance. For example, when a first puncturing pattern is applied, puncturing may be applied only to the secondary 20 MHz band within the 80 MHz band. For example, when a second puncturing pattern is applied, puncturing may be applied to only any one of two secondary 20 MHz bands included in the secondary 40 MHz band within the 80 MHz band. For example, when a third puncturing pattern is applied, puncturing may be applied to only the secondary 20 MHz band included in the primary 80 MHz band within the 160 MHz band (or 80+80 MHz band). For example, when a fourth puncturing is applied, puncturing may be applied to at least one 20 MHz channel not belonging to a primary 40 MHz band in the presence of the primary 40 MHZ band included in the 80 MHaz band within the 160 MHz band (or 80+80 MHz band).

Information related to the preamble puncturing applied to the PPDU may be included in U-SIG and/or EHT-SIG. For example, a first field of the U-SIG may include information related to a contiguous bandwidth, and second field of the U-SIG may include information related to the preamble puncturing applied to the PPDU.

For example, the U-SIG and the EHT-SIG may include the information related to the preamble puncturing, based on the following method. When a bandwidth of the PPDU exceeds 80 MHz, the U-SIG may be configured individually in unit of 80 MHz. For example, when the bandwidth of the PPDU is 160 MHZ, the PPDU may include a first U-SIG for a first 80 MHz band and a second U-SIG for a second 80 MHz band. In this case, a first field of the first U-SIG may include information related to a 160 MHz bandwidth, and a second field of the first U-SIG may include information related to a preamble puncturing (i.e., information related to a preamble puncturing pattern) applied to the first 80 MHz band. In addition, a first field of the second U-SIG may include information related to a 160 MHz bandwidth, and a second field of the second U-SIG may include information related to a preamble puncturing (i.e., information related to a preamble puncturing pattern) applied to the second 80 MHz band. Meanwhile, an EHT-SIG contiguous to the first U-SIG may include information related to a preamble puncturing applied to the second 80 MHz band (i.e., information related to a preamble puncturing pattern), and an EHT-SIG contiguous to the second U-SIG may include information related to a preamble puncturing (i.e., information related to a preamble puncturing pattern) applied to the first 80 MHz band.

Additionally or alternatively, the U-SIG and the EHT-SIG may include the information related to the preamble puncturing, based on the following method. The U-SIG may include information related to a preamble puncturing (i.e., information related to a preamble puncturing pattern) for all bands. That is, the EHT-SIG may not include the information related to the preamble puncturing, and only the U-SIG may include the information related to the preamble puncturing (i.e., the information related to the preamble puncturing pattern).

The U-SIG may be configured in unit of 20 MHz. For example, when an 80 MHz PPDU is configured, the U-SIG may be duplicated. That is, four identical U-SIGs may be included in the 80 MHz PPDU. PPDUs exceeding an 80 MHz bandwidth may include different U-SIGs.

The EHT-SIG of FIG. 10 may include control information for the receiving STA. The EHT-SIG may be transmitted through at least one symbol, and one symbol may have a length of 4 μs. Information related to the number of symbols used for the EHT-SIG may be included in the U-SIG.

The EHT-SIG may include a technical feature of the HE-SIG-B described with reference to FIG. 8 and FIG. 9. For example, the EHT-SIG may include a common field and a user-specific field as in the example of FIG. 8. The common field of the EHT-SIG may be omitted, and the number of user-specific fields may be determined based on the number of users.

As in the example of FIG. 8, the common field of the EHT-SIG and the user-specific field of the EHT-SIG may be individually coded. One user block field included in the user-specific field may include information for two users, but a last user block field included in the user-specific field may include information for one user. That is, one user block field of the EHT-SIG may include up to two user fields. As in the example of FIG. 9, each user field may be related to MU-MIMO allocation, or may be related to non-MU-MIMO allocation.

As in the example of FIG. 8, the common field of the EHT-SIG may include a CRC bit and a tail bit. A length of the CRC bit may be determined as 4 bits. A length of the tail bit may be determined as 6 bits, and may be set to '000000'.

As in the example of FIG. 8, the common field of the EHT-SIG may include RU allocation information. The RU allocation information may imply information related to a location of an RU to which a plurality of users (i.e., a plurality of receiving STAs) are allocated. The RU allocation information may be configured in unit of 8 bits (or N bits), as in Table 1.

A mode in which the common field of the EHT-SIG is omitted may be supported. The mode in the common field of the EHT-SIG is omitted may be called a compressed mode. When the compressed mode is used, a plurality of users (i.e., a plurality of receiving STAs) may decode the PPDU (e.g., the data field of the PPDU), based on non-OFDMA. That is, the plurality of users of the EHT PPDU may decode the PPDU (e.g., the data field of the PPDU) received through the same frequency band. Meanwhile, when a non-compressed mode is used, the plurality of users of the EHT PPDU may decode the PPDU (e.g., the data field of the PPDU), based on OFDMA. That is, the plurality of users of the EHT PPDU may receive the PPDU (e.g., the data field of the PPDU) through different frequency bands.

The EHT-SIG may be configured based on various MCS schemes. As described above, information related to an MCS scheme applied to the EHT-SIG may be included in U-SIG. The EHT-SIG may be configured based on a DCM scheme. For example, among N data tones (e.g., 52 data tones) allocated for the EHT-SIG, a first modulation scheme may be applied to half of consecutive tones, and a second modulation scheme may be applied to the remaining half of the consecutive tones. That is, a transmitting STA may use the first modulation scheme to modulate specific control information through a first symbol and allocate it to half of the consecutive tones, and may use the second modulation scheme to modulate the same control information by using a second symbol and allocate it to the remaining half of the consecutive tones. As described above, information (e.g., a 1-bit field) regarding whether the DCM scheme is applied to the EHT-SIG may be included in the U-SIG. An HE-STF of FIG. 10 may be used for improving automatic gain control estimation in a multiple input multiple output (MIMO) environment or an OFDMA environment. An HE-LTF of FIG. 10 may be used for estimating a channel in the MIMO environment or the OFDMA environment.

Information related to a type of STF and/or LTF (information related to a GI applied to LTF is also included) may be included in a SIG-A field and/or SIG-B field or the like of FIG. 10.

A PPDU (e.g., EHT-PPDU) of FIG. 10 may be configured based on the example of FIG. 5 and FIG. 6.

For example, an EHT PPDU transmitted on a 20 MHz band, i.e., a 20 MHz EHT PPDU, may be configured based on the RU of FIG. 5. That is, a location of an RU of EHT-STF, EHT-LTF, and data fields included in the EHT PPDU may be determined as shown in FIG. 5.

An EHT PPDU transmitted on a 40 MHz band, i.e., a 40 MHZ EHT PPDU, may be configured based on the RU of FIG. 6. That is, a location of an RU of EHT-STF, EHT-LTF, and data fields included in the EHT PPDU may be determined as shown in FIG. 6.

Since the RU location of FIG. 6 corresponds to 40 MHz, a tone-plan for 80 MHz may be determined when the pattern of FIG. 6 is repeated twice. That is, an 80 MHz EHT PPDU may be transmitted based on a new tone-plan in which not the RU of FIG. 7 but the RU of FIG. 6 is repeated twice.

When the pattern of FIG. 6 is repeated twice, 23 tones (i.e., 11 guard tones+12 guard tones) may be configured in a DC region. That is, a tone-plan for an 80 MHz EHT PPDU allocated based on OFDMA may have 23 DC tones. Unlike this, an 80 MHz EHT PPDU allocated based on non-OFDMA (i.e., a non-OFDMA full bandwidth 80 MHz PPDU) may be configured based on a 996-RU, and may include 5 DC tones, 12 left guard tones, and 11 right guard tones.

A tone-plan for 160/240/320 MHz may be configured in such a manner that the pattern of FIG. 6 is repeated several times.

The PPDU of FIG. 10 may be determined (or identified) as an EHT PPDU based on the following method.

A receiving STA may determine a type of an RX PPDU as the EHT PPDU, based on the following aspect. For example, the RX PPDU may be determined as the EHT PPDU: 1) when a first symbol after an L-LTF signal of the RX PPDU is a BPSK symbol; 2) when RL-SIG in which the L-SIG of the RX PPDU is repeated is detected; and 3) when a result of applying "modulo 3" to a value of a length field of the L-SIG of the RX PPDU is detected as "0". When the RX PPDU is determined as the EHT PPDU, the receiving STA may detect a type of the EHT PPDU (e.g., an SU/MU/Trigger-based/Extended Range type), based on bit information included in a symbol after the RL-SIG of FIG. 10. In other words, the receiving STA may determine the RX PPDU as the EHT PPDU, based on: 1) a first symbol after an L-LTF signal, which is a BPSK symbol; 2) RL-SIG contiguous to the L-SIG field and identical to L-SIG; 3) L-SIG including a length field in which a result of applying "modulo 3" is set to "0"; and 4) a 3-bit PHY version identifier of the aforementioned U-SIG (e.g., a PHY version identifier having a first value).

For example, the receiving STA may determine the type of the RX PPDU as the EHT PPDU, based on the following aspect. For example, the RX PPDU may be determined as the HE PPDU: 1) when a first symbol after an L-LTF signal is a BPSK symbol; 2) when RL-SIG in which the L-SIG is repeated is detected; and 3) when a result of applying "modulo 3" to a value of a length field of the L-SIG is detected as "1" or "2".

For example, the receiving STA may determine the type of the RX PPDU as a non-HT, HT, and VHT PPDU, based on the following aspect. For example, the RX PPDU may be determined as the non-HT, HT, and VHT PPDU: 1) when a first symbol after an L-LTF signal is a BPSK symbol; and 2) when RL-SIG in which L-SIG is repeated is not detected. In addition, even if the receiving STA detects that the RL-SIG is repeated, when a result of applying "modulo 3" to the length value of the L-SIG is detected as "0", the RX PPDU may be determined as the non-HT, HT, and VHT PPDU.

In the following example, a signal represented as a (TX/RX/UL/DL) signal, a (TX/RX/UL/DL) frame, a (TX/RX/UL/DL) packet, a (TX/RX/UL/DL) data unit, (TX/RX/UL/DL) data, or the like may be a signal transmitted/received based on the PPDU of FIG. 10. The PPDU of FIG. 10 may be used to transmit/receive frames of various types. For example, the PPDU of FIG. 10 may be used for a control frame. An example of the control frame may include a request to send (RTS), a clear to send (CTS), a power save-poll (PS-poll), BlockACKReq, BlockAck, a null data packet (NDP) announcement, and a trigger frame. For example, the PPDU of FIG. 10 may be used for a management frame. An example of the management frame may include a beacon frame, a (re-)association request frame, a (re-)association response frame, a probe request frame, and a probe response frame. For example, the PPDU of FIG. 10 may be used for a data frame. For example, the PPDU of FIG. 10 may be used to simultaneously transmit at least two or more of the control frames, the management frame, and the data frame.

Figure 11:
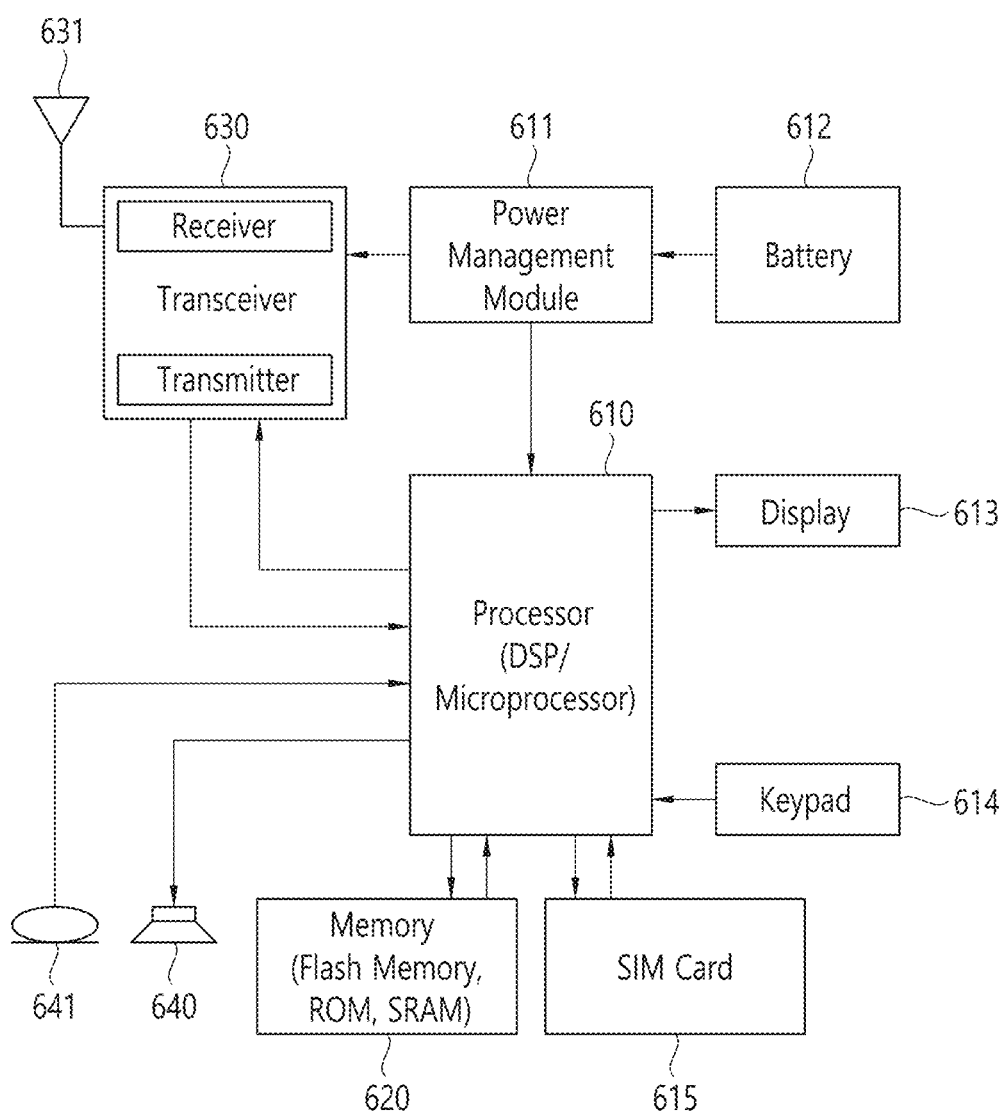
FIG. 11 illustrates an example of a modified transmission device and/or receiving device of the present specification.

FIG. 11 illustrates an example of a modified transmission device and/or receiving device of the present specification.

Each device/STA of the sub-figure (a)/(b) of FIG. 1 may be modified as shown in FIG. 11. A transceiver 630 of FIG. 11 may be identical to the transceivers 113 and 123 of FIG. 1. The transceiver 630 of FIG. 11 may include a receiver and a transmitter.

A processor 610 of FIG. 11 may be identical to the processors 111 and 121 of FIG. 1. Alternatively, the processor 610 of FIG. 11 may be identical to the processing chips 114 and 124 of FIG. 1.

A memory 620 of FIG. 11 may be identical to the memories 112 and 122 of FIG. 1. Alternatively, the memory 620 of FIG. 11 may be a separate external memory different from the memories 112 and 122 of FIG. 1.

Referring to FIG. 11, a power management module 611 manages power for the processor 610 and/or the transceiver 630. A battery 612 supplies power to the power management module 611. A display 613 outputs a result processed by the processor 610. A keypad 614 receives inputs to be used by the processor 610. The keypad 614 may be displayed on the display 613. A SIM card 615 may be an integrated circuit which is used to securely store an international mobile subscriber identity (IMSI) and its related key, which are used to identify and authenticate subscribers on mobile telephony devices such as mobile phones and computers.

Referring to FIG. 11, a speaker 640 may output a result related to a sound processed by the processor 610. A microphone 641 may receive an input related to a sound to be used by the processor 610.

1. Tone Plan in 802.11ax WLAN System

In the present specification, a tone plan relates to a rule for determining a size of a resource unit (RU) and/or a location of the RU. Hereinafter, a PPDU based on the IEEE 802.11ax standard, that is, a tone plan applied to an HE PPDU, will be described. In other words, hereinafter, the RU size and RU location applied to the HE PPDU are described, and control information related to the RU applied to the HE PPDU is described.

In the present specification, control information related to an RU (or control information related to a tone plan) may include a size and location of the RU, information of a user STA allocated to a specific RU, a frequency bandwidth for a PPDU in which the RU is included, and/or control information on a modulation scheme applied to the specific RU. The control information related to the RU may be included in an SIG field. For example, in the IEEE 802.11ax standard, the control information related to the RU is included in an HE-SIG-B field. That is, in a process of generating a TX PPDU, a transmitting STA may allow the control information on the RU included in the PPDU to be included in the HE-SIG-B field. In addition, a receiving STA may receive an HE-SIG-B included in an RX PPDU and obtain control information included in the HE-SIG-B, so as to determine whether there is an RU allocated to the receiving STA and decode the allocated RU, based on the HE-SIG-B.

In the IEEE 802.11ax standard, HE-STF, HE-LTF, and data fields may be configured in unit of RUs. That is, when a first RU for a first receiving STA is configured, STF/LTF/data fields for the first receiving STA may be transmitted/received through the first RU.

In the IEEE 802.11ax standard, a PPDU (i.e., SU PPDU) for one receiving STA and a PPDU (i.e., MU PPDU) for a plurality of receiving STAs are separately defined, and respective tone plans are separately defined. Specific details will be described below.

The RU defined in 11ax may include a plurality of subcarriers. For example, when the RU includes N subcarriers, it may be expressed by an N-tone RU or N RUs. A location of a specific RU may be expressed by a subcarrier index. The subcarrier index may be defined in unit of a subcarrier frequency spacing. In the 11ax standard, the subcarrier frequency spacing is 312.5 kHz or 78.125 kHz, and the subcarrier frequency spacing for the RU is 78.125 kHz. That is, a subcarrier index +1 for the RU may mean a location which is more increased by 78.125 kHz than a DC tone, and a subcarrier index −1 for the RU may mean a location which is more decreased by 78.125 kHz than the DC tone. For example, when the location of the specific RU is expressed by [−121:−96], the RU may be located in a region from a subcarrier index −121 to a subcarrier index −96. As a result, the RU may include 26 subcarriers.

The N-tone RU may include a pre-set pilot tone.

2. Null Subcarrier and Pilot Subcarrier

A subcarrier and resource allocation in the 802.11ax system will be described.

An OFDM symbol consists of subcarriers, and the number of subcarriers may function as a bandwidth of a PPDU. In the WLAN 802.11 system, a data subcarrier used for data transmission, a pilot subcarrier used for phase information and parameter tacking, and an unused subcarrier not used for data transmission and pilot transmission are defined.

An HE MU PPDU which uses OFDMA transmission may be transmitted by mixing a 26-tone RU, a 52-tone RU, a 106-tone RU, a 242-tone RU, a 484-tone RU, and a 996-tone RU.

Herein, the 26-tone RU consists of 24 data subcarriers and 2 pilot subcarriers. The 52-tone RU consists of 48 data subcarriers and 4 pilot subcarriers. The 106-tone RU consists of 102 data subcarriers and 4 pilot subcarriers. The 242-tone RU consists of 234 data subcarriers and 8 pilot subcarriers. The 484-tone RU consists of 468 data subcarriers and 16 pilot subcarriers. The 996-tone RU consists of 980 data subcarriers and 16 pilot subcarriers.

1) Null Subcarrier

As shown in FIG. 5 to FIG. 7, a null subcarrier exists between 26-tone RU, 52-tone RU, and 106-tone RU locations. The null subcarrier is located near a DC or edge tone to protect against transmit center frequency leakage, receiver DC offset, and interference from an adjacent RU. The null subcarrier has zero energy. An index of the null subcarrier is listed as in FIG. 24.

A null subcarrier location for each 80 MHz frequency segment of the 80+80 MHz HE PPDU shall follow the location of the 80 MHz HE PPDU.

2) Pilot Subcarrier

If a pilot subcarrier exists in an HE-LTF field of HE SU PPDU, HE MU PPDU, HE ER SU PPDU, or HE TB PPDU, a location of a pilot sequence in an HE-LTF field and data field may be the same as a location of 4× HE-LTF. In 1× HE-LTF, the location of the pilot sequence in HE-LTF is configured based on pilot subcarriers for a data field multiplied 4 times. If the pilot subcarrier exists in 2× HE-LTF, the location of the pilot subcarrier shall be the same as a location of a pilot in a 4× data symbol. All pilot subcarriers are located at even-numbered indices listed in FIGS. 25 and 26.

At 160 MHz or 80+80 MHz, the location of the pilot subcarrier shall use the same 80 MHz location for 80 MHz of both sides.

3. HE Transmit Procedure and Constellation Mapping

Figure 21:
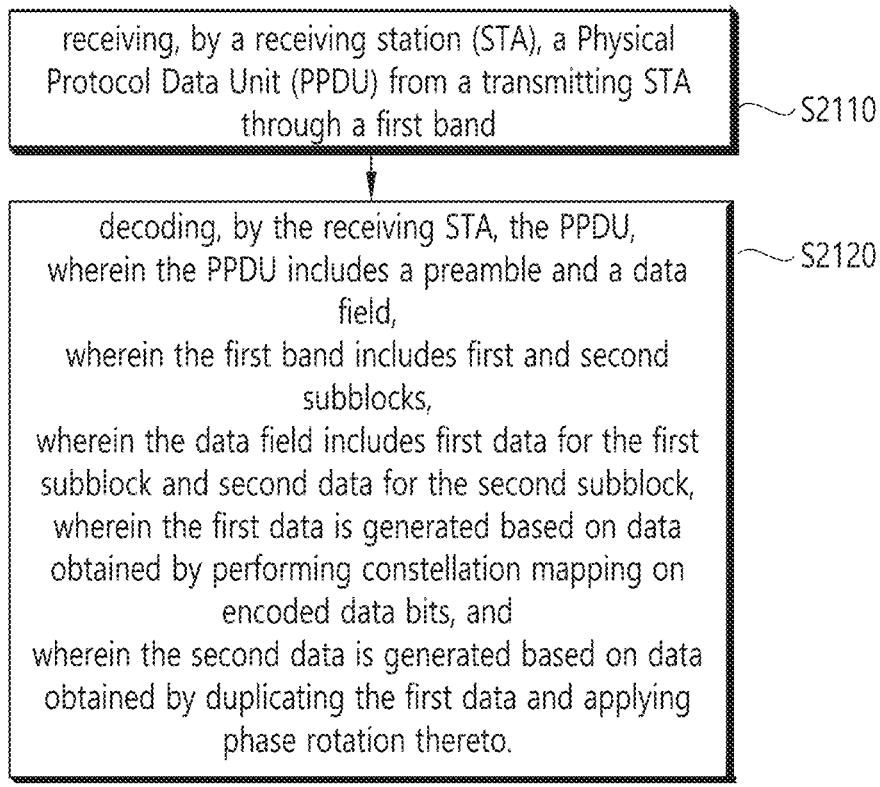
FIG. 21 is a flow diagram illustrating a procedure for a receiving STA to receive a PPDU according to the present embodiment.

In an 802.11ax wireless local area network (WLAN) system, transmission procedures (or transmit procedures) in a physical layer (PHY) include a procedure for an HE Single User (SU) PPDU, a transmission procedure for an HE extended range (ER) SU PPDU, a transmission procedure for an HE Multi User (MU) PPDU, and a transmission procedure for an HE trigger-based (TB) PPDU. A FORMAT field of a PHY-TXSTART.request (TXVECTOR) may be the same as HE_SU, HE_MU, HE_ER_SU or HE_TB. The transmission procedures do not describe operations of optional features, such as Dual Carrier Modulation (DCM). Among the diverse transmission procedures, FIG. 21 shows only the PHY transmission procedure for the HE SU PPDU.

Figure 12:
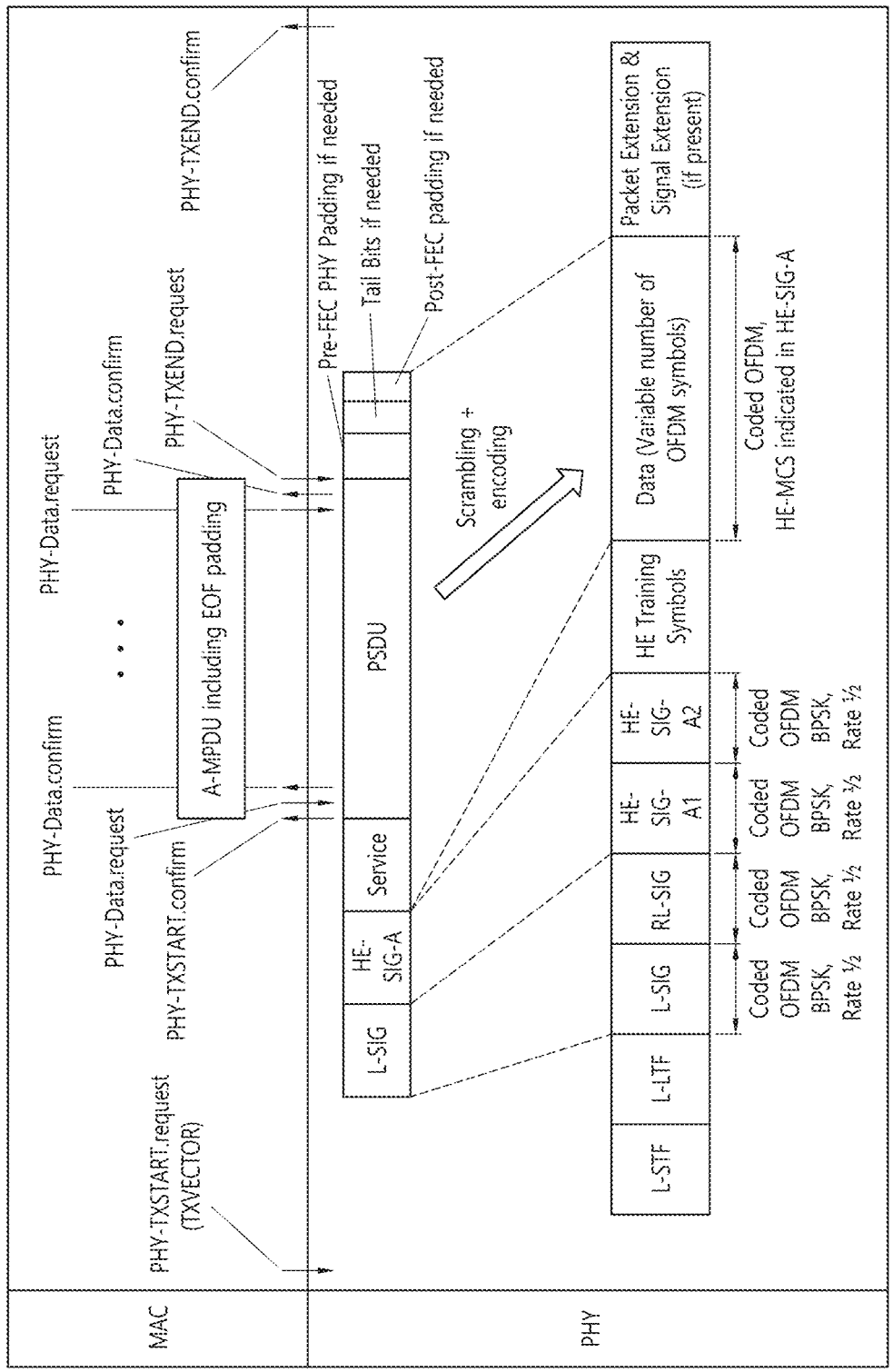
FIG. 12 shows an example of a PHY transmission procedure for a HE SU PPDU.

FIG. 12 shows an example of a PHY transmission procedure for HE SU PPDU.

In order to transmit data, the MAC generates a PHY-TXSTART.request primitive, which causes a PHY entity to enter a transmit state. Additionally, the PHY is configured to operate in an appropriate frequency via station management through PLME. Other transmission parameters, such as HE-MCS, coding type, and transmission power are configured through a PHY-SAP by using a PHY-TXSTART.request (TXVECTOR) primitive. After transmitting a PPDU that transfers (or communicates) a trigger frame, a MAC sublayer may issue a PHY-TRIGGER.request together with a TRIGVECTOR parameter, which provides information needed for demodulating an HE TB PPDU response that is expected of the PHY entity.

The PHY indicates statuses of a primary channel and another channel via PHY-CCA.indication. The transmission of a PPDU should be started by the PHY after receiving the PHY-TXSTART.request (TXVECTOR) primitive.

After a PHY preamble transmission is started, the PHY entity immediately initiates data scrambling and data encoding. An encoding method for the data field is based on FEC_CODING, CH_BANDWIDTH, NUM_STS, STBC, MCS, and NUM_USERS parameters of the TXVECTOR.

A SERVICE field and a PSDU are encoded in a transmitter (or transmitting device) block diagram, which will be described later on. Data should be exchanged between the MAC and the PHY through a PHY-DATA.request(DATA) primitive that is issued by the MAC and PHY-DATA.confirm primitives that are issued by the PHY. A PHY padding bit is applied to the PSDU in order to set a number of bits of the coded PSDU to be an integer multiple of a number of coded bits per OFDM symbol.

The transmission is swiftly (or quickly) ended by the MAC through a PHY-TXEND.request primitive. The PSDU transmission is ended upon receiving a PHY-TXEND.request primitive. Each PHY-TXEND.request primitive mat notify its reception together with a PHY-TXEND.confirm primitive from the PHY.

A packet extension and/or a signal extension may exist in a PPDU. A PHY-TXEND.confirm primitive is generated at an actual end time of a most recent PPDU, an end time of a packet extension, and an end time of a signal extension.

In the PHY, a Guard Interval (GI) that is indicated together with a GI duration in a GI_TYPE parameter of the TXVECTOR is inserted in all data OFDM symbols as a solution for a delay spread.

If the PPDU transmission is completed, the PHY entity enters a receive state.

Figure 13:
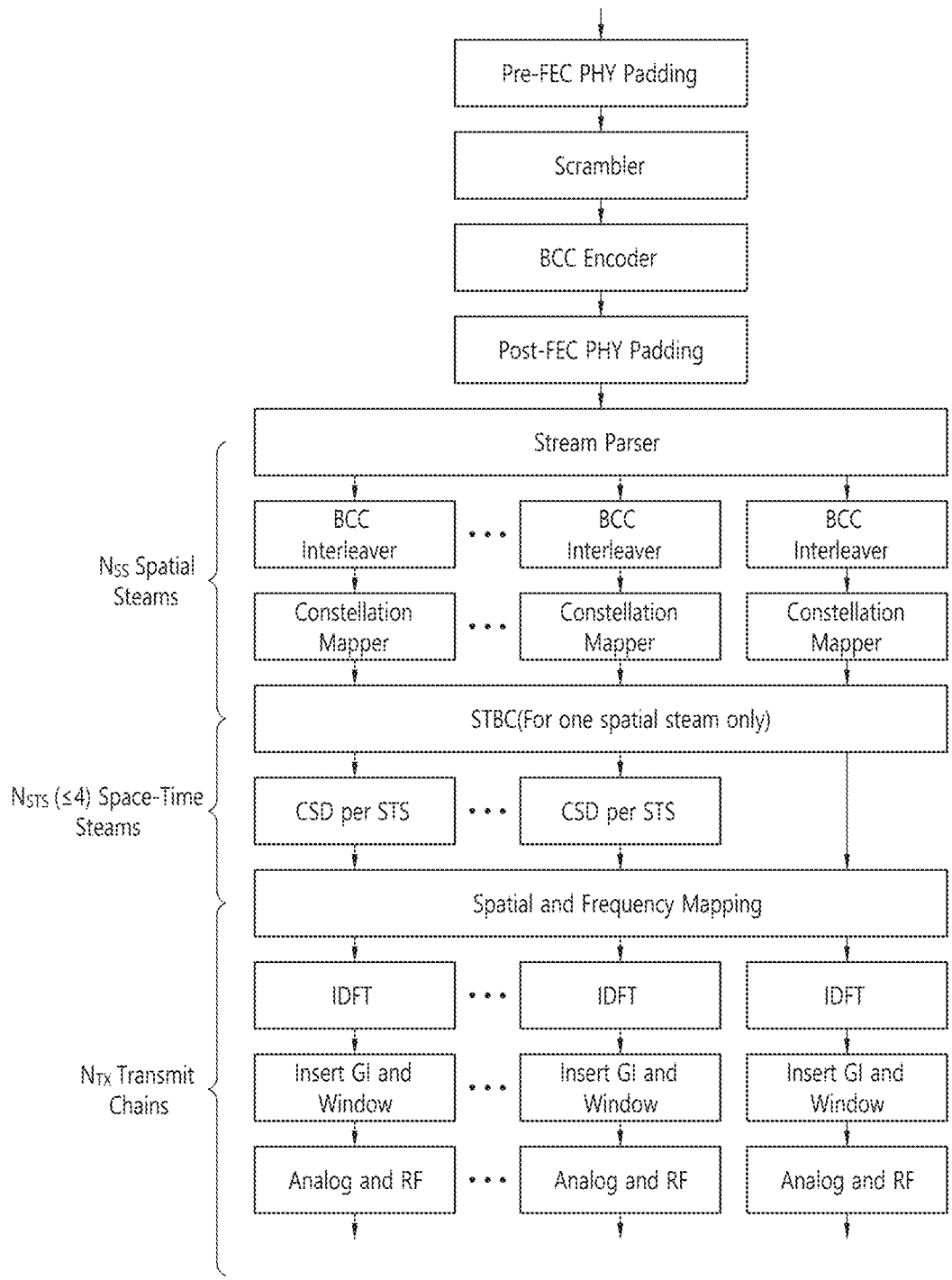
FIG. 13 shows an example of a block diagram of a transmitter generating a data field of a HE PPDU using BCC encoding.

In order to generate each field of the HE PPDU, the following block diagrams are used.
  a) pre-FEC PHY padding
  b) Scrambler
  c) FEC (BCC or LDPC) encoders
  d) post-FEC PHY padding
  e) Stream parser f) Segment parser (for contiguous 160 MHz and non-contiguous 80+80 MHz transmission)
g) BCC interleaver
h) Constellation mapper
i) DCM tone mapper
j) Pilot insertion
k) Replication over multiple 20 MHz (for BW>20 MHz)
l) Multiplication by 1st column of $P_{HE-LTF}$
m) LDPC tone mapper
n) Segment deparser
o) Space time block code (STBC) encoder for one spatial stream
p) Cyclic shift diversity (CSD) per STS insertion
q) Spatial mapper
r) Frequency mapping
s) Inverse discrete Fourier transform (IDFT)
f) Cyclic shift diversity (CSD) per chain insertion
u) Guard interval (GI) insertion
v) Windowing FIG. 13 shows an example of a block diagram of a transmitter generating a data field of a HE PPDU using BCC encoding.

FIG. 13 shows a block diagram of a transmitter used to generate the data field of the HE PPDU to which binary convolution coding (BCC) encoding is applied and capable of UL transmission or DL non-MU MIMO transmission in 26-tone RU, 52-tone RU, 106-tone RU, or 242-tone RU.

Referring to FIG. 13, with respect to the bit stream input to the transmitter block diagram, 1) Pre-FEC PHY padding is performed, 2) scrambling operation is performed, 3) BCC encoding is performed, and 4) Post-FEC PHY padding is performed, 5) a stream parsing operation for mapping coded bits to a specific spatial stream is performed, 6) BCC interleaving is performed for each spatial stream, 7) Constellation mapping is performed for each spatial stream, and a modulation symbol may be generated.

The Dual Carrier Modulation (DCM) tone mapper, which is part of the constellation mapper, is applied only when DCM is indicated for the RU. A subset of these transmitter block diagrams, consisting of the Constellation Mapper and CSD blocks, as well as the blocks to the right of the spatial mapping blocks, are also used to generate HE-LTF fields or HE-STF fields.

Figure 14:
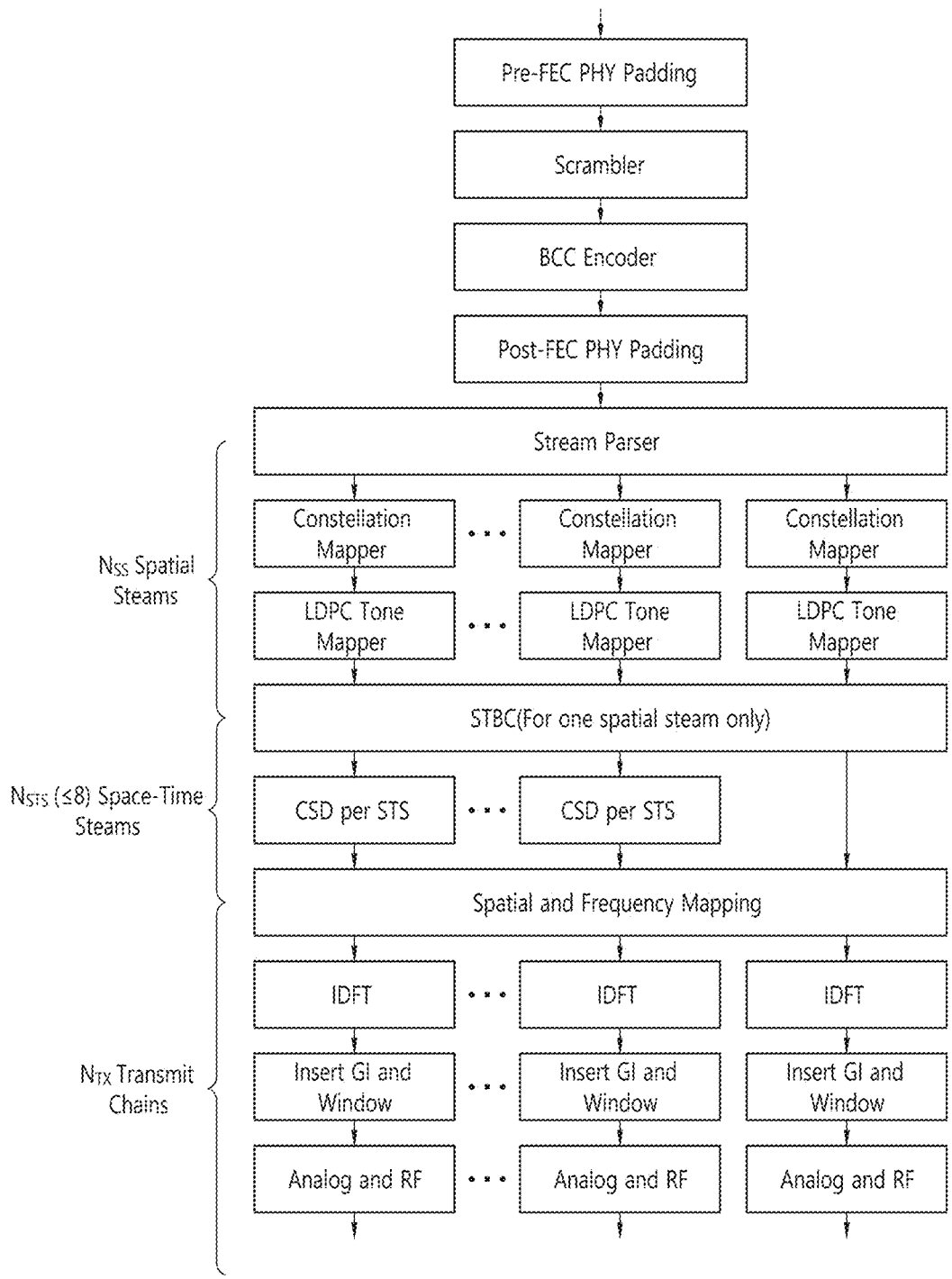
FIG. 14 shows an example of a block diagram of a transmitter generating a data field of a HE PPDU using LDPC encoding.

FIG. 14 shows an example of a block diagram of a transmitter generating a data field of a HE PPDU using LDPC encoding.

FIG. 14 shows a block diagram of a transmitter used to generate the data field of the HE PPDU to which Low Density Parity Check (LDPC) encoding is applied and capable of UL transmission or DL non-MU MIMO transmission in 26-tone RU, 52-tone RU, 106-tone RU, 242-tone RU, 484-tone RU, or 996-tone RU.

Referring to FIG. 14, with respect to the bit stream input to the transmitter block diagram, 1) Pre-FEC PHY padding is performed, 2) scrambling operation is performed, 3) LDPC encoding is performed, and 4) Post-FEC PHY padding is performed, 5) a stream parsing operation for mapping coded bits to a specific spatial stream is performed, 6) constellation mapping is performed for each spatial stream, 7) the LDPC tone mapping may be performed on modulation symbols generated based on the constellation mapping.

The transmitter block diagram of FIG. 14 is also applied to the data field of the HE MU PPDU and the data field of the HE TB PPDU transmitted in an RU allocated to one user (regardless of whether or not spatially multiplexed with another user). The DCM tone mapper, which is part of the constellation mapper, is applied only when DCM is indicated for the RU.

Since the transmitter block diagrams of FIGS. 13 and 14 do not have a segment parser, the above operations are performed for one frequency segment. However, if necessary, segment parsing may be performed to divide frequency segments by adding a segment parser after the stream parser in the transmitter block diagrams of FIGS. 13 and 14. Accordingly, the BCC interleaving, the constellation mapping, or the LDPC tone mapping may be performed for each frequency segment (for each RU in Multi-RU).

In addition, in HE MU transmission, except that cyclic shift diversity (CSD) is performed with knowledge of the space-time stream start index for that user, the PPDU encoding processor uses Resource Unit (RU) is performed independently. All user data of the RU is combined and mapped to the transmission chain of the spatial mapping block.

Constellation mapping will be described below.

Constellation mapping refers to mapping of input bits of the constellation mapper and complex constellation points for binary phase shift keying (BPSK), quadrature phase shift keying (QPSK), quadrature amplitude modulation (16-QAM), and 256-QAM. That is, the constellation mapper may map bits from an output of a stream parser or a segment parser (if present) to complex constellation points according to a modulation scheme.

The DCM scheme may be applied only to a data field and/or SIG-B field of an HE PPDU. Additionally, the DCM scheme may be used or may not be used in the transmitting device (optional feature).

A more detailed description of the DCM scheme of 11ax is as follows.

DCM is an optional modulation scheme for HE-SIG-B and data fields. DCM may be applied to an HE SU PPDU and an HE ER SU PPDU. In an HE MU PPDU or HE TB PPDU, DCM may be applied to an RU that includes data for one user and cannot be applied to an RU that includes data for multiple users.

DCM is applicable only for HE-MCS 0, 1, 3, and 4. DCM is applicable only for $N_{SS}$=1 or $N_{SS}$=2 (In case of a single user RU in an HE MU PPDU, $N_{SS,r,u}$=1 or $N_{SS,r,u}$=2). DCM is not applicable together with MU-MIMO or STBC.

When DCM is used, a bit sequence is mapped to one symbol pair $(d'_k, d'_{q(k)})$. In order to use a frequency diversity for a 996-tone RU or a smaller RU, k has a range of $0<=k<=N_{SD}-1$, and q(k) has a range of $N_{SD}<=q(k)<=2N_{SD}-1$. For a 2×996-tone RU, k has a range of $0<=k<=N_{SD}/2-1$, and q(k) has a range of $N_{SD}/2<=q(k)<=N_{SD}-1$. In order to maximize the frequency diversity, an index of a DCM subcarrier pair (k, q(k)) is $q(k)=k+N_{SD}$ for a 996-tone RU or a smaller RU, and $q(k)=k+N_{SD}/2$ for a 2×996-tone RU. Herein, when DCM=1, $N_{SD}$ is given a value of $N_{SD}$. And, when DCM=0, $N_{SD}$ is given a half value of $N_{SD}$.

A modulation bit having DCM applied thereto may be described as in FIG. 27.

Hereinafter, LDPC tone mapping will be described.

LDPC tone mapping should be performed in all LDPC-coded streams by using an LDPC tone mapping distance parameter $D_{TM}$. $D_{TM}$ is a constant for each bandwidth and is given a value for each band, as shown in FIG. 28. LDPC tone mapping should not be performed for an encoded stream by using BCC.

For a VHT PPDU transmission, LDPC tone mapping for an LDPC-coded stream related to a user u may be performed, as shown in FIG. 29, by substituting a stream of complex numbers generated by a constellation mapper.

As a result of the LDPC tone mapping operation, each of two consecutively generated complex constellation numbers $d'_{k,i,n,l,u}$ and $d'_{k+1,i,n,l,u}$ may be transmitted from two data tones, respectively, each data tone being spaced apart by at least $D_{TM}-1$. For example, $d'_{k,i,n,l,u}$ may be transmitted from a first data tone, $d'_{k+1,i,n,l,u}$ may be transmitted from a second data tone, and the first data tone and the second data tone may be spaced apart by $D_{TM}-1$. The aforementioned operation is the same as performing block-interleaving on complex numbers $d'_{0,i,n,l,u}, \ldots, d'_{NSD-1,i,n,l,u}$ for variables i, n, and u by using a matrix having a $D_{TM}$ row and a $N_{SD}/D_{TM}$ column (for 20 MHz, 40 MHz, 80 MHz or 80+80 MHz) or $N_{SD}/2*D_{TM}$ column (for 160 MHZ). At this point, $d'_{0,i,n,l,u}, \ldots, d'_{NSD-1,i,n,l,u}$ are written row-wise in the matrix, and $d'_{0,i,n,l,u}, \ldots, d'_{NSD-1,i,n,l,u}$ are read column-wise from the matrix.

LDPC tone mapping is separately performed for an upper 80 MHz and a lower 80 MHz of a 160 MHz or 80+80 MHz transmission that is indicated by frequency subblock index 1.

Since LDPC tone mapping is not performed for a BCC-coded stream, the equation in FIG. 30 may be applied to the BCC-coded stream.

Additionally, LDPC tone mapping should be performed in all LDPC-coded streams that are mapped to a resource unit (RU). LDPC tone mapping should not be performed on a stream having used BCC. When DCM is applied to an LDPC-coded stream, $D_{TM\_DCM}$ should be applied to both a lower half data subcarrier of the RU and an upper half data subcarrier of the RU. LDPC tone mapping distance parameters $D_{TM}$ and $D_{TM\_DCM}$ are constant values for each of an RU size and another RU size in FIG. 31.

LDPC tone mapping distance parameters $D_{TM}$ and $D_{TM\_DCM}$ are applied to a frequency subblock l=0 and frequency subblock l=1, respectively.

For an HE PPDU without DCM, in an r-th RU, LDPC tone mapping for an LDPC-coded stream related to a user u may be performed, as shown in FIG. 32, by substituting a stream of complex numbers generated by a constellation mapper.

For an HE PPDU having DCM applied in a Data field, in an r-th RU, LDPC tone mapping for an LDPC-coded stream related to a user u may be performed, as shown in FIG. 33, by substituting a stream of complex numbers generated by a constellation mapper.

An LDPC tone mapper for a 26-, 52-, 106-, 242-, 484- and 996-tone is defined as one segment. LDPC tone mapping is separately performed for upper 80 MHz and lower 80 MHz frequency segments of a 2×996-tone RU that is indicated by frequency subblock index 1.

Since LDPC tone mapping is not performed for a BCC-coded stream, the equation in FIG. 34 may be applied to the BCC-coded stream.

4. Embodiment Applicable to the Present Disclosure

The WLAN 802.11 system considers transmission of an increased stream using a band wider than that of the existing 11ax or more antennas to increase the peak throughput. In addition, the present specification also considers a method of aggregating and using various bands and various preamble puncturing patterns in Non-OFDMA transmission.

In this specification, duplicated transmission for increasing the transmission range in EHT PPDU transmission of a wireless LAN system (802.11) is proposed.

A representative structure of an 802.11be PPDU (EHT PPDU) is shown in FIG. 10. The U-SIG consists of a version independent field and a version dependent field. In addition, U-SIG consists of two symbols, two symbols are jointly encoded, and each 20 MHz consists of 52 data tones and 4 pilot tones. Also, U-SIG is modulated in the same way as HE-SIG-A. That is, U-SIG is modulated by BPSK 1/2 code rate. In addition, EHT-SIG can be encoded with variable MCS, and may have a 1 2 1 2 . . . structure as in the existing 11ax or another structure (e.g. 1 2 3 4 . . . or 1 2 1 2 3 4 3 4 . . . structure). In addition, the EHT-SIG may be configured in units of 80 MHZ, and in a bandwidth of 80 MHz or higher, the EHT-SIG may be duplicated in units of 80 MHZ.

Meanwhile, 802.11be can support an indoor environment using low power in a vast area of 6 GHz. In this case, the data part can be repeatedly sent to obtain more reliable performance, and the present specification proposes the following method.

4.1. Duplicated Transmission

Figure 15:
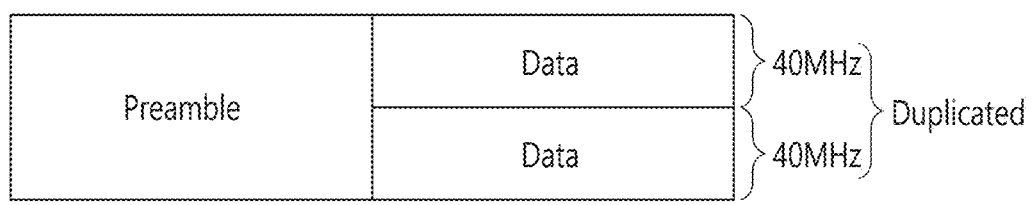
FIG. 15 shows an example in which data is duplicated for each 40 MHz when transmitting an 80 MHz PPDU.

FIG. 15 shows an example in which data is duplicated for each 40 MHz when transmitting an 80 MHz PPDU.

802.11be supports 20/40/80/160/80+80/320/160+160 MHz (additional 240/160/80 MHz), and this embodiment proposes that data is duplicated and transmitted in a specific bandwidth. For example, as shown in FIG. 15, when transmitting 80 MHZ, data of each 40 MHz may be duplicated.

In this specification, this transmission is called duplicated transmission, and other names may be used in practice. Duplicated transmission can be used only for i) 80/160/80+80/320/160+160 MHz PPDU transmission, ii) only for MCS0 or MCS0+DCM, and iii) only for 1 stream. iv) may be limited to SU transmission only, and v) Puncturing may not be applied.

The same data may be simply repeated in two blocks (each 40 MHz data part in FIG. 15), but the constellation may be different for performance improvement. For example, let's assume that the number of subcarriers into which data is inserted excluding the pilot in the first block and the second block is N, and the constellation in each subcarrier of the first block is d_1,n (n=0~N−1). At this time, the constellation in the second block can be defined as follows.

$$d\_2,n = d\_1,n * \exp(j*n*\pi(n=0 \text{ to } N-1, k=1 \text{ or } -1 \text{ or other integer})$$

Figure 16:
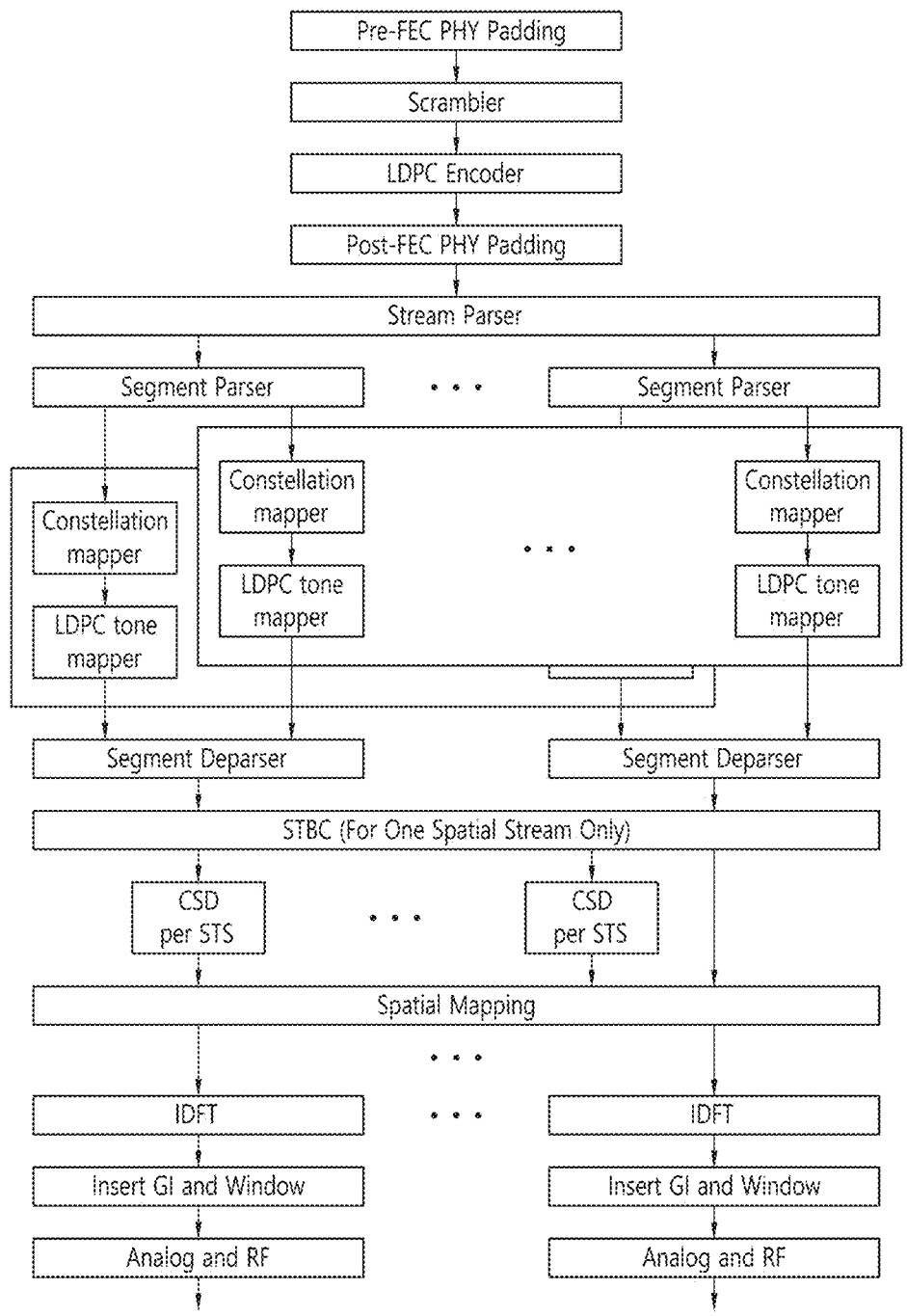
FIG. 16 shows a block diagram of a data field of an SU PPDU in 160 MHz transmission using LDPC.

FIG. 16 shows a block diagram of a data field of an SU PPDU in 160 MHz transmission using LDPC.

Basically, in 160/80+80/320/160+160 MHz transmission, data bits (coded bits) are distributed for each 80 MHz block by the segment parser, and constellation mapping or LDPC tone mapping is performed for each 80 MHz block. In the case of duplicated transmission, a segment parser may be required even for transmission below 160 MHz, and data bits can be distributed only in the first block. After performing constellation mapping, the same data or a phase rotated constellation for performance improvement such as PAPR can be inserted in the second block. After that, data such as LDPC tone mapper and pilot insertion can be processed in each block. Afterwards, it can be combined into one frequency segment by segment deparser, and this block may be needed even for transmissions below 160 MHz. Alternatively, after performing the LDPC tone mapper in the first block, the constellation value can be simply repeated in the second block, and phase rotation for performance improvement such as PAPR can be additionally applied. After that, data such as pilot insertion can be processed in each block. Alternatively, data bits after coding may be equally distributed to the first block and the second block and processed for each block.

For example, in 320/160+160 MHz duplicated transmission, data bits are distributed for each 80 MHz of the first block (160 MHz) by the segment parser, and phase rotation is performed for the same data or performance improvement in the second block (another 160 MHz) after constellation mapping A constellation may be inserted. After that, data such as LDPC tone mapper and pilot insertion can be processed in each block. Alternatively, after performing the LDPC tone mapper in the first block, the constellation value can be simply repeated in the second block, and phase rotation for performance improvement such as PAPR can be additionally applied. After that, data such as pilot insertion can be processed in each block. Alternatively, data bits are distributed for each 80 MHz of the first block (160 MHz) by the segment parser, and the same data bits are distributed to each 80 MHz of the second block (another 160 MHz) to process data bits for each block.

For example, when performing the LDPC tone mapper, data can be processed as follows in the distributed block, and N_SD is the number of data subcarriers in the block, not the total bandwidth. That is, N_SD of duplicated transmission may be a value obtained by dividing N_SD corresponding to the entire bandwidth by 2. (In the case of DCM, N_SD corresponding to the entire bandwidth is half of N_SD if there is no DCM, so in the case of duplicate transmission, the given N_SD value is divided by 2 regardless of DCM. That is, in the case of DCM+duplicated transmission, the original N_SD is divided by 4). However, since 484 RU is used at 80 MHz and duplication occurs, N_SD/2 of 996 RU corresponding to 80 MHz is not applied and N_SD of 484 RU can be used.

For a HE PPDU without DCM, LDPC tone mapping for an LDPC-encoded stream for user u in the r-th RU can be performed as shown in FIG. 35 by replacing a stream of complex numbers generated by a constellation mapper.

For the HE PPDU to which DCM is applied to the data field, LDPC tone mapping for the LDPC-encoded stream for user u in the r-th RU can be performed as shown in FIG. 36 by replacing the stream of complex numbers generated by the constellation mapper.

It is duplicated in units of 80 MHz blocks to perform duplicated transmission. For example, in the case of 320/160+160 MHz transmission, four 80 MHz blocks can be configured with the same data. In this case, N_SD of each 80 MHz block may be a value obtained by dividing the total bandwidth N_SD by 4. As another example, in the case of 240/160+80 MHz transmission, three 80 MHz blocks may be composed of the same data. In this case, N_SD of each 80 MHz block may be a value obtained by dividing the total bandwidth N_SD by 3. As another example, in the case of 160/80+80 MHz transmission, two 80 MHz blocks may be composed of the same data. In this case, N_SD of each 80 MHz block may be a value obtained by dividing the entire bandwidth N_SD by 2. In this case, data is distributed to only one 80 MHz block, processed, and then the same is repeated in other 80 MHz blocks right after the constellation mapper or LDPC tone mapper, and phase rotation can be applied to improve PAPR performance. It can handle procedures such as insertion. Alternatively, data bits after coding may be equally distributed to all 80 MHz blocks and processed for each 80 MHz block.

In addition, as an exception, only 240/160+80 MHz is a dup for each 80 MHz, and half of the bandwidth may be duplicated in other bandwidths.

In addition, 240/160+80 MHz can be one 320/160+160 MHz transmission, and it can be seen that 80 MHz is punctured. The actual BW field is indicated as 320/160+160 MHZ transmission, but 80 MHz may be punctured and may be 240/160+80 MHz transmission. In general, even if 320/160+160 MHz duplicated transmission is configured as 160 MHz duplication, in the case of 240/160+80 MHz transmission in which 80 MHz is actually punctured, it may be 80 MHz duplicated transmission.

Figure 17:
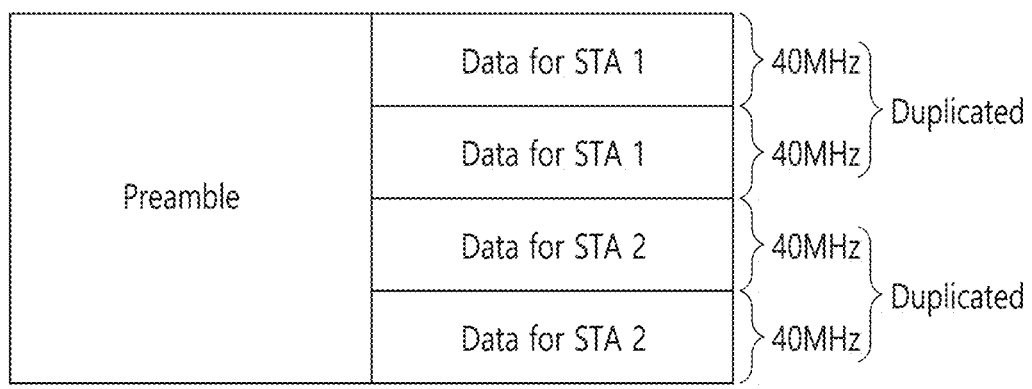
FIG. 17 shows an example of MU OFDMA duplicated transmission.

FIG. 17 shows an example of MU OFDMA duplicated transmission.

As shown in FIG. 17, MU OFDMA duplicated transmission may be considered. After each STA is allocated a portion of the total bandwidth, a duplication situation in each allocated bandwidth may be considered. As for the duplication method in each allocated bandwidth, the method proposed in the above SU situation can be used as it is. FIG. 17 shows an example of duplicated transmission when each STA 1 and STA 2 is allocated 80 MHz in 160 MHz transmission.

Or, after distributing data bits to one RU, inserting a pilot along with constellation mapping and LDPC tone mapping, repeating this to another RU, and finally applying phase rotation to improve performance and PAPR.

4.2. Signaling for Duplicated Transmission

Duplicated transmission can be indicated in the BW field and can be indicated using 3 bits as shown below.

TABLE 3

| Bit | Entry |
| --- | --- |
| 000 | 20 MHz |
| 001 | 40 MHz |
| 010 | 80 MHz |
| 011 | 160/80 + 80 MHz |
| 100 | 320/160 + 160 MHz |
| 101 | 80 MHz with 40 MHz Dup |
| 110 | 160/80 + 80 MHz with 80 MHz Dup |
| 111 | 320/160 + 160 MHz with 160 MHz Dup |

Above, the indication for 240/160+80 MHz was not considered, and the Dup mode was not considered below 40 MHz. When considering the Dup mode, 4 bits are required and the BW field can be designed as follows.

TABLE 4

| Bit | Entry |
| --- | --- |
| 0000 | 20 MHz |
| 0001 | 40 MHz |
| 0010 | 80 MHz |
| 0011 | 160/80 + 80 MHz |
| 0100 | 240/160 + 80 MHz |
| 0101 | 320/160 + 160 MHz |
| 0110 | 40 MHz with 20 MHz Dup |
| 0111 | 80 MHz with 40 MHz Dup |
| 1000 | 160/80 + 80 MHz with 80 MHz Dup |
| 1001 | 320/160 + 160 MHz with 160 MHz Dup |
| 1010~1111 | Reserved |

The following is a BW field when 40 MHz with 20 MHz Dup is not considered in Table 4 above.

TABLE 5

| Bit | Entry |
| --- | --- |
| 0000 | 20 MHz |
| 0001 | 40 MHz |
| 0010 | 80 MHz |
| 0011 | 160/80 + 80 MHz |
| 0100 | 240/160 + 80 MHz |
| 0101 | 320/160 + 160 MHz |
| 0110 | 80 MHz with 40 MHz Dup |
| 0111 | 160/80 + 80 MHz with 80 MHz Dup |
| 1000 | 320/160 + 160 MHz with 160 MHz Dup |
| 1001~1111 | Reserved |

The following is an example of the BW field in the case of considering the situation of dup for each 80 MHz.

TABLE 6

| Bit | Entry |
| --- | --- |
| 000 | 20 MHz |
| 001 | 40 MHz |
| 010 | 80 MHz |
| 011 | 160/80 + 80 MHz |
| 100 | 320/160 + 160 MHz |
| 101 | 160/80 + 80 MHz with 80 MHz Dup |
| 110 | 320/160 + 160 MHz with 80 MHz Dup |
| 111 | Reserved |

The following is an example of the BW field in the case of considering the situation of dup for each 80 MHz including 240/160+80 MHz.

TABLE 7

| Bit | Entry |
| --- | --- |
| 0000 | 20 MHz |
| 0001 | 40 MHz |
| 0010 | 80 MHz |
| 0011 | 160/80 + 80 MHz |
| 0100 | 240/160 + 80 MHz |
| 0101 | 320/160 + 160 MHz |
| 0110 | 160/80 + 80 MHz with 80 MHz Dup |
| 0111 | 240/160 + 80 MHz with 80 MHz Dup |
| 1000 | 320/160 + 160 MHz with 80 MHz Dup |
| 1001~1111 | Reserved |

The following is an example of a BW field when considering a situation in which only 240/160+80 MHz is duplicated by 80 MHz and half of the bandwidth is duplicated.

TABLE 8

| Bit | Entry |
| --- | --- |
| 0000 | 20 MHz |
| 0001 | 40 MHz |
| 0010 | 80 MHz |
| 0011 | 160/80 + 80 MHz |
| 0100 | 240/160 + 80 MHz |
| 0101 | 320/160 + 160 MHz |

TABLE 8-continued

| Bit | Entry |
| --- | --- |
| 0110 | 80 MHz with 40 MHz Dup |
| 0111 | 160/80 + 80 MHz with 80 MHz Dup |
| 1000 | 240/160 + 80 MHz with 80 MHz Dup |
| 1001 | 320/160 + 160 MHz with 160 MHz Dup |
| 1010~1111 | Reserved |

The following is a case where a 40 MHz with 20 MHz duplicated entry is included in the BW field of Table 8.

TABLE 9

| Bit | Entry |
| --- | --- |
| 0000 | 20 MHz |
| 0001 | 40 MHz |
| 0010 | 80 MHz |
| 0011 | 160/80 + 80 MHz |
| 0100 | 240/160 + 80 MHz |
| 0101 | 320/160 + 160 MHz |
| 0110 | 40 MHz with 20 MHz Dup |
| 0111 | 80 MHz with 40 MHz Dup |
| 1000 | 160/80 + 80 MHz with 80 MHz Dup |
| 1001 | 240/160 + + 80 MHz with 80 MHz Dup |
| 1010 | 320/160 + 160 MHz with 160 MHz Dup |
| 1011~1111 | Reserved |

In Table 9, when 320/160+160 MHz duplicated transmission is transmitted in a BW field where the 240/160+80 MHz entry is not separately used, 80 MHz is punctured and becomes an actual 240/160+80 MHz duplicated transmission, even if the BW field is set to 320/160+160 MHz with 160 MHz Dup (duplication), it may be 240/160+80 MHz duplicated transmission of 80 MHz dup.

In addition to the method of using duplicated transmission using the BW field as described above, a 1-bit duplicated transmission field may be defined and indicated. This 1 bit can be inserted into a U-SIG independent or U-SIG dependent field or EHT-SIG common. If duplicated transmission is considered during MU OFDMA transmission, insertion into the user field of the EHT-SIG may be considered.

Alternatively, a duplicate transmission PPDU may be defined in the PPDU type field and indicated. In this case, the BW field may consist of 2 bits as follows. In this case, duplicated transmission is used only in 80/160/80+80/320/160+160 MHz.

TABLE 10

| Bit | Entry |
| --- | --- |
| 00 | 80 MHz |
| 01 | 160/80 + 80 MHz |
| 10 | 320/160 + 160 MHz |
| 11 | Reserved |

Alternatively, it may consist of 2 bits as follows. In this case, duplicated transmission is used only in 80/160/80+80/240/160+80/320/160+160 MHz.

TABLE 11

| Bit | Entry |
| --- | --- |
| 00 | 80 MHz |
| 01 | 160/80 + 80 MHz |
| 10 | 240/160 + 80 MHz |
| 11 | 320/160 + 160 MHz |

Alternatively, it may consist of 2 bits as follows. In this case, duplicated transmission is used only in 40/80/160/80+80/320/160+160 MHz.

TABLE 12

| Bit | Entry |
| --- | --- |
| 00 | 40 MHz |
| 01 | 80 MHz |
| 10 | 160/80 + 80 MHz |
| 11 | 320/160 + 160 MHz |

Alternatively, it may consist of 3 bits as follows. In this case, duplicated transmission is used only in 40/80/160/80+80/240/160+80/320/160+160 MHz.

TABLE 13

| Bit | Entry |
| --- | --- |
| 000 | 40 MHz |
| 001 | 80 MHz |
| 010 | 160/80 + 80 MHz |
| 011 | 240/160 + 80 MHz |
| 100 | 320/160 + 160 MHz |
| 101~111 | Reserved |

In the case of indicating duplicated transmission in the above PPDU type field, only one specific duplication mode is considered in each bandwidth. (For example, in case of dup for half of the bandwidth, in case of dup for each 80 MHz in 240/160+80 MHz)

Additionally, it may consist of 2 bits as follows. In this case, duplicated transmission is used only in 80/160/80+80/320/160+160 MHz, and 160 MHz dup or 80 MHz dup of data is used in 320/160+160 MHz.

TABLE 14

| Bit | Entry |
| --- | --- |
| 00 | 80 MHz |
| 01 | 160/80 + 80 MHz |
| 10 | 320/160 + 160 MHz with 160 MHz dup |
| 11 | 320/160 + 160 MHzwith 80 MHz dup |

Alternatively, it may consist of 3 bits as follows. In this case, duplicated transmission is used only in 80/160/80+80/240/160+80/320/160+160 MHz. In 320/160+160 MHz, the case where 160 MHz dup or 80 MHz dup of data is used is considered.

TABLE 15

| Bit | Entry |
| --- | --- |
| 000 | 80 MHz |
| 001 | 160/80 + 80 MHz |
| 010 | 240/160 + 80 MHz |

TABLE 15-continued

| Bit | Entry |
| --- | --- |
| 011 | 320/160 + 160 MHz with 160 MHz dup |
| 100 | 320/160 + 160 MHz with 80 MHz dup |
| 101~111 | Reserved |

Alternatively, it may consist of 3 bits as follows. In this case, duplicated transmission is used only in 40/80/160/80+80/320/160+160 MHz. In 320/160+160 MHz, the case where 160 MHz dup or 80 MHz dup of data is used is considered.

TABLE 16

| Bit | Entry |
| --- | --- |
| 000 | 40 MHz |
| 001 | 80 MHz |
| 010 | 160/80 + 80 MHz |
| 011 | 320/160 + 160 MHz with 160 MHz dup |
| 100 | 320/160 + 160 MHz with 80 MHz dup |
| 101~111 | Reserved |

Alternatively, it may consist of 3 bits as follows. In this case, duplicated transmission is used only in 40/80/160/80+80/240/160+80/320/160+160 MHz. In 320/160+160 MHz, the case where 160 MHz dup or 80 MHz dup of data is used is considered.

TABLE 17

| Bit | Entry |
| --- | --- |
| 000 | 40 MHz |
| 001 | 80 MHz |
| 010 | 160/80 + 80 MHz |
| 011 | 240/160 + 80 MHz |
| 100 | 320/160 + 160 MHz with 160 MHz dup |
| 101 | 320/160 + 160 MHz with 80 MHz dup |
| 110~111 | Reserved |

Figure 18:
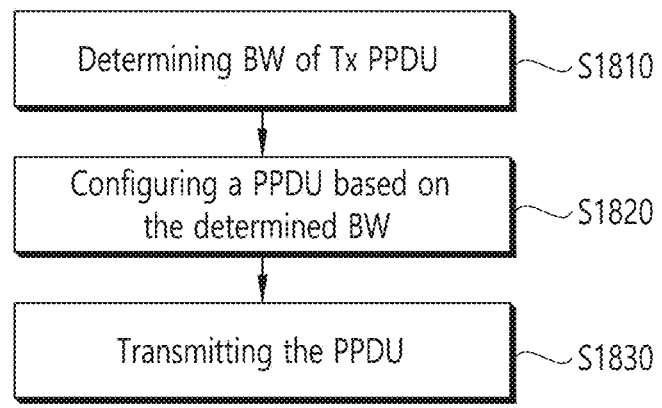
FIG. 18 is a flow diagram illustrating the operation of a transmitting apparatus according to the present embodiment.

FIG. 18 is a flowchart showing operations of a transmitting apparatus according to the present embodiment.

The example of FIG. 18 may be performed by a transmitting STA or a transmitting device (AP and/or non-AP STA). For example, the example of FIG. 18 may be performed by an AP transmitting EHT SU PPDU, EHT ER SU PPDU, and EHT MU PPDU. The example of FIG. 18 can be performed by a non-AP that transmits EHT SU PPDU, EHT ER SU PPDU, and EHT MU PPDU.

Part of each step (or detailed sub-step that will be described later on) in the example of FIG. 18 may be skipped (or omitted) or varied.

Through step S1810, since a transmitting device (i.e., a transmitting STA) may perform a Channel Access operation according to the above-described specification. For example, the transmitting STA transmits 320 MHz/160+160 MHz mask PPDU if secondary 20 MHz, secondary 40 MHz, secondary 80 MHz, secondary 160 MHz are idle during PIFS (example only, can be other IFS) just before the start of TXOP (or just before the start of PPDU transmission), BW may be determined as 320 MHz or 160+160 MHz through S1810.

Through step S1820, the transmitting STA may configure a PPDU. For example, the PPDU may be EHT SU PPDU, EHT ER SU PPDU, or EHT MU PPDU.

The transmitting STA may perform step S1820 based on the BW determined through step S1810.

That is, as described above, specific (BW) n-bit (e.g., 4-bit) information may be included in the U-SIG or EHT-SIG. For example, the bandwidth field of U-SIG or EHG-SIG may be configured based on the following elements.
- 0: 20 MHz
- 1: 40 MHz
- 2: 80 MHz non-preamble puncturing mode
- 3: 160 MHz and 80+80 MHz non-preamble puncturing mode
- 4: 240 MHz and 160+80 MHz non-preamble puncturing mode
- 5: 320 MHz and 160+160 MHz non-preamble puncturing mode
- 6: preamble puncturing in 80 MHz, where in the preamble only the secondary 20 MHz is punctured
- 7: preamble puncturing in 80 MHz, where in the preamble only one of the two 20 MHz subchannels in secondary 40 MHz is punctured.
- 8: preamble puncturing in 160 MHz or 80+80 MHz, where in the primary 80 MHz of the preamble only the secondary 20 MHz is punctured
- 9: preamble puncturing in 160 MHz or 80+80 MHz, where in the primary 80 MHz of the preamble the primary 40 MHz is present, and at least one 20 MHz subchannel that is not in the primary 40 MHz is punctured
- 10: preamble puncturing in 240 MHz or 160+80 MHz, where in the primary 80 MHz. of the preamble only the secondary 20 MHz is punctured
- 11: preamble puncturing in 240 MHz or 160+80 MHz, where in the primary 80 MHz of the preamble the primary 40 MHz is present, and at least one 20 MHz subchannel that is not in the primary 40 MHz is punctured
- 12: preamble puncturing in 320 MHz or 160+160 MHz, where in the primary 80 MHz of the preamble only the secondary 20 MHz is punctured
- 13: preamble puncturing in 320 MHz or 160+160 MHz, where in the primary 80 MHz of the preamble the primary 40 MHz is present, and at least one 20 MHz subchannel that is not in the primary 40 MHz is punctured
- 14~15: reserved The transmitting device may transmit the PPDU configured through step S1820 to the receiving device based on step S1830.

While performing step S1830, the transmitting device may perform at least one of operations such as CSD, Spatial Mapping, IDFT/IFFT operation, and GI insertion.

The signal(s)/field(s)/sequences(s) that is/are configured according to the present specification may be transmitted in the format of FIG. 10.

For example, the aforementioned U-SIG may be transmitted based on two OFDM symbols. For example, one OFDM symbol may include 26-bit information. The 26-bit information may include the aforementioned 4-bit BW information. Instead of 26-bit information, arbitrary m-bit information may be used.

BCC encoding of 1/2 code rate may be applied to 26-bit information. Interleaving by an interleaver may be applied to BCC coded bits (i.e., 52 bits). Constellation mapping by a constellation mapper may be performed on the interleaved 52 bits. Specifically, 52 BPSK symbols may be generated by applying the BPSK module. 52 BSPK symbols may be matched to the remaining frequency domains (−28 to +28) except for DC tones and pilot tones (−21, −7, +7, and +21) tones. Thereafter, it may be transmitted to the receiving STA through phase rotation, CSD, spatial mapping, IDFT/IFFT operation, and the like.

Figure 19:
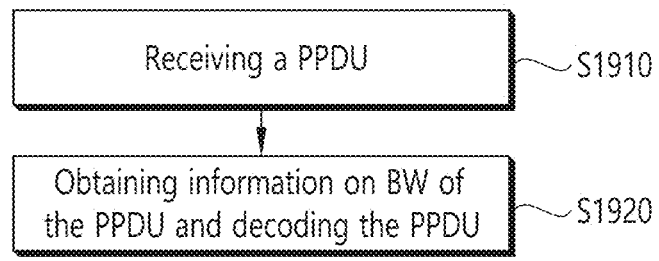
FIG. 19 is a flow diagram illustrating the operation of a receiving apparatus according to the present embodiment.

FIG. 19 is a flowchart showing operations of a receiving apparatus according to the present embodiment.

The aforementioned PPDU may be received according to the example of FIG. 19.

The example of FIG. 19 may be performed in a receiving STA or a receiving device (AP and/or non-AP STA). For example, the example of FIG. 19 may be performed by a non-AP receiving EHT SU PPDU, EHT ER SU PPDU, and EHT MU PPDU. The example of FIG. 19 can be performed by an AP transmitting EHT SU PPDU and EHT ER SU PPDU.

Part of each step (or detailed sub-step that will be described later on) in the example of FIG. 19 may be skipped (or omitted).

The receiving device (receiving STA) may receive all or part of the PPDU through step S1910. The received signal may be in the form of FIG. 10.

The sub-step of step S1910 may be determined based on step S1830 of FIG. 18. That is, in step S1910, an operation of restoring the result of the CSD, Spatial Mapping, IDFT/IFFT operation, and GI insertion operation applied in step S1830 may be performed.

In step S1920, the receiving STA may obtain information about the BW of the EHT PPDU by decoding information included in the U-SIG or EHT-SIG.

Through this, the receiving STA can complete decoding of other fields/symbols of the received PPDU.

As a result, the receiving STA may decode the data field included in the PPDU through step S1920. Thereafter, the receiving STA may perform a processing operation of transferring data decoded from the data field to a higher layer (eg, MAC layer). In addition, when generation of a signal is indicated from the upper layer to the PHY layer in response to data delivered to the upper layer, a subsequent operation may be performed.

Hereinafter, the above-described embodiment will be described with reference to FIG. 1 to FIG. 19.

Figure 20:
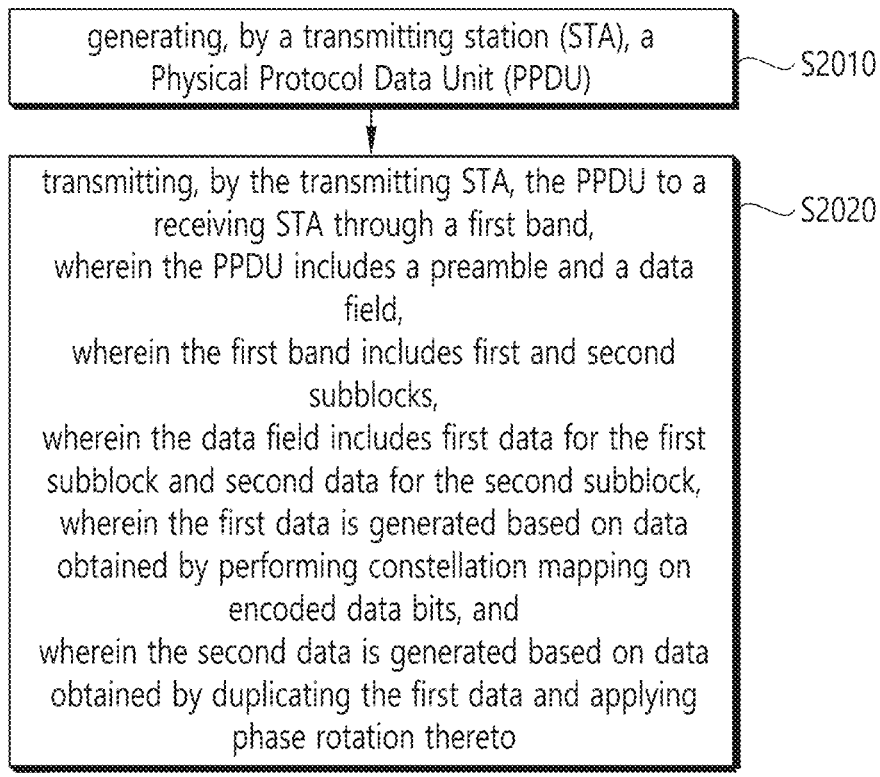
FIG. 20 is a flow diagram illustrating a procedure for a transmitting STA to transmit a PPDU according to the present embodiment.

FIG. 20 is a flowchart showing a procedure for transmitting a PPDU, by a transmitting STA, according to the present embodiment.

The example of FIG. 20 may be performed in a network environment in which a next generation WLAN system (IEEE 802.11be or EHT WLAN system) is supported. The next generation wireless LAN system is a WLAN system that is enhanced from an 802.11ax system and may, therefore, satisfy backward compatibility with the 802.11ax system.

The example of FIG. 20 is performed by a transmitting STA, and the transmitting STA may correspond to an access point (AP). A receiving STA of FIG. 20 may correspond to an STA that supports an Extremely High Throughput (EHT) WLAN system.

This embodiment proposes a method and apparatus for duplicating and transmitting data in order to increase a transmission distance in transmission of an EHT PPDU. The 802.11be wireless LAN system can support transmission in an indoor environment using low power in a broadband of 6 GHz. Accordingly, in order to obtain more reliable performance, a method of repeatedly transmitting data in the frequency domain in the EHT PPDU is proposed.

In step S2010, a transmitting station (STA) generates a Physical Protocol Data Unit (PPDU).

In step S2020, the transmitting STA transmits the PPDU to a receiving STA through a first band.

The PPDU may be an Extremely High Throughput (EHT) PPDU supporting an 802.11be wireless LAN system. The PPDU includes a preamble and a data field. The preamble is a Legacy-Short Training Field (L-STF), a Legacy-Long Training Field (L-LTF), a Legacy-Signal (L-SIG), an Universal-Signal (U-SIG), an EHT-SIG, an EHT-STF and an EHT-LTF.

The first band includes first and second subblocks. The data field includes first data for the first subblock and second data for the second subblock. The first data is generated based on data obtained by performing constellation mapping on encoded data bits. The second data is generated based on data obtained by duplicating the first data and applying phase rotation thereto.

That is, the data field is configured of duplicated (or repeated) data for each subblock. The above-described transmission method may be referred to as a duplicated transmission. The subblock is divided into frequency domains. In this embodiment, reliable performance can be obtained even for transmission over a longer distance by repeatedly transmitting data in the frequency domain in the EHT PPDU.

In order to perform the duplicated transmission, the following conditions must be satisfied. First, the encoded data bits may be modulated with Binary Phase Shift Keying (BPSK) and Dual Carrier Modulation (DCM) may be applied. That is, constellation mapping may be performed on the encoded data bits based on the BPSK and the DCM.

If the encoded data bits are modulated based on a first Modulation and Coding Scheme (MCS), the first MCS may be named EHT-MCS 14 as a modulation scheme to which BPSK and DCM are applied. In this case, the EHT-MCS 14 may be referred to as an MCS defined for duplicated transmission. In this case, the coding rate may be 1/2. Information on the first MCS may be included in a user field of the EHT-SIG. The PPDU may be a single-user (SU) PPDU supporting a single spatial stream (Nss=1).

Conventionally, after encoding a data bit stream (or bit stream), data bits can be distributed for each subblock. The encoded data bits may be distributed for each subblock based on a segment parser or an implementation method without a segment parser. For example, the first data bit may be distributed to the first subblock, and the second data bit may be distributed to the second subblock. Constellation mapping, LDPC tone mapping, and pilot insertion may be performed on the distributed data bits for each subblock.

However, in this embodiment, the encoded data bits are distributed only to the first subblock, constellation mapping (or constellation mapping and LDPC tone mapping) is performed on the encoded data bits distributed to the first subblock (based on BPSK and DCM) in the first subblock, and a method of duplicating the constellation mapped data as it is and including phase rotation applied data in the second subblock is proposed. For example, the encoded data bits are distributed only to the first subblock, and constellation mapping and low density parity check (LDPC) tone mapping are performed on the encoded data bits in the first subblock based on based on Binary Phase Shift Keying (BPSK) and Dual Carrier Modulation (DCM), and the second data may be obtained by duplicating the constellation mapped and LDPC tone mapped data and applying phase rotation.

A first pilot tone for the first data may be inserted into the first subblock after the first data is generated. A second pilot tone for the second data may be inserted into the second subblock after the second data is generated.

This embodiment proposes a method of duplicating and transmitting data using half of the entire band (first band) for transmitting the PPDU. That is, the bandwidths of the first and second subblocks are the same.

If the first band is an 80 MHz band, the first subblock may be a first 484-tone RU having a low frequency, and the second subblock may be a second 484-tone RU having a high frequency. The first and second 484-tone RUs may be resource units including 484 tones.

If the first band is a 160 MHz band, the first subblock may be a first 996-tone RU having a low frequency, and the second subblock may be a second 996-tone RU having a high frequency. The first and second 996-tone RUs may be resource units including 996 tones.

If the first band is a 320 MHz band, the first subblock may be a first 2×996 tone RU having a low frequency, and the second subblock may be a second 2×996 tone RU having a high frequency. The first and second 2×996 tone RUs may be resource units including 2×996 tones.

When the PPDU is transmitted in a multi-user (MU) OFDMA scheme and the receiving STA includes first and second receiving STAs, it may be assumed that the first subblock is allocated to the first receiving STA, and the second subblock is allocated to the second receiving STA. In this case, the PPDU may be configured to transmit duplicated data for each receiving STA. For example, the first subblock includes first and second RUs, and data allocated to the first RU and data allocated to the second RU may be duplicated and transmitted to the first receiving STA. The second subblock includes third and fourth RUs, and data allocated to the third RU and data allocated to the fourth RU may be duplicated and transmitted to the second receiving STA. The first and second RUs have half the size of the first subblock, and the third and fourth RUs have half the size of the second subblock.

FIG. 21 is a flowchart showing a procedure for receiving a PPDU, by a receiving STA, according to the present embodiment.

The example of FIG. 21 may be performed in a network environment in which a next generation WLAN system (IEEE 802.11be or EHT WLAN system) is supported. The next generation wireless LAN system is a WLAN system that is enhanced from an 802.11ax system and may, therefore, satisfy backward compatibility with the 802.11ax system.

The example of FIG. 21 may be performed by a receiving STA, and the receiving STA may correspond to an STA supporting an Extremely High Throughput (EHT) WLAN system. A transmitting STA of FIG. 21 may correspond to an access point (AP).

This embodiment proposes a method and apparatus for duplicating and transmitting data in order to increase a transmission distance in transmission of an EHT PPDU. The 802.11be wireless LAN system can support transmission in an indoor environment using low power in a broadband of 6 GHz. Accordingly, in order to obtain more reliable performance, a method of repeatedly transmitting data in the frequency domain in the EHT PPDU is proposed.

In step S2110, a receiving station (STA) receives a Physical Protocol Data Unit (PPDU) from a transmitting STA through a first band.

In step S2120, the receiving STA decodes the PPDU.

The PPDU may be an Extremely High Throughput (EHT) PPDU supporting an 802.11be wireless LAN system. The PPDU includes a preamble and a data field. The preamble is a Legacy-Short Training Field (L-STF), a Legacy-Long Training Field (L-LTF), a Legacy-Signal (L-SIG), an Universal-Signal (U-SIG), an EHT-SIG, an EHT-STF and an EHT-LTF.

The first band includes first and second subblocks. The data field includes first data for the first subblock and second data for the second subblock. The first data is generated based on data obtained by performing constellation mapping on encoded data bits. The second data is generated based on data obtained by duplicating the first data and applying phase rotation thereto.

That is, the data field is configured of duplicated (or repeated) data for each subblock. The above-described transmission method may be referred to as a duplicated transmission. The subblock is divided into frequency domains. In this embodiment, reliable performance can be obtained even for transmission over a longer distance by repeatedly transmitting data in the frequency domain in the EHT PPDU.

In order to perform the duplicated transmission, the following conditions must be satisfied. First, the encoded data bits may be modulated with Binary Phase Shift Keying (BPSK) and Dual Carrier Modulation (DCM) may be applied. That is, constellation mapping may be performed on the encoded data bits based on the BPSK and the DCM.

If the encoded data bits are modulated based on a first Modulation and Coding Scheme (MCS), the first MCS may be named EHT-MCS 14 as a modulation scheme to which BPSK and DCM are applied. In this case, the EHT-MCS 14 may be referred to as an MCS defined for duplicated transmission. In this case, the coding rate may be 1/2. Information on the first MCS may be included in a user field of the EHT-SIG. The PPDU may be a single-user (SU) PPDU supporting a single spatial stream (Nss=1).

Conventionally, after encoding a data bit stream (or bit stream), data bits can be distributed for each subblock. The encoded data bits may be distributed for each subblock based on a segment parser or an implementation method without a segment parser. For example, the first data bit may be distributed to the first subblock, and the second data bit may be distributed to the second subblock. Constellation mapping, LDPC tone mapping, and pilot insertion may be performed on the distributed data bits for each subblock.

However, in this embodiment, the encoded data bits are distributed only to the first subblock, constellation mapping (or constellation mapping and LDPC tone mapping) is performed on the encoded data bits distributed to the first subblock (based on BPSK and DCM) in the first subblock, and a method of duplicating the constellation mapped data as it is and including phase rotation applied data in the second subblock is proposed. For example, the encoded data bits are distributed only to the first subblock, and constellation mapping and low density parity check (LDPC) tone mapping are performed on the encoded data bits in the first subblock based on based on Binary Phase Shift Keying (BPSK) and Dual Carrier Modulation (DCM), and the second data may be obtained by duplicating the constellation mapped and LDPC tone mapped data and applying phase rotation.

A first pilot tone for the first data may be inserted into the first subblock after the first data is generated. A second pilot tone for the second data may be inserted into the second subblock after the second data is generated.

This embodiment proposes a method of duplicating and transmitting data using half of the entire band (first band) for transmitting the PPDU. That is, the bandwidths of the first and second subblocks are the same.

If the first band is an 80 MHz band, the first subblock may be a first 484-tone RU having a low frequency, and the second subblock may be a second 484-tone RU having a high frequency. The first and second 484-tone RUs may be resource units including 484 tones.

If the first band is a 160 MHz band, the first subblock may be a first 996-tone RU having a low frequency, and the second subblock may be a second 996-tone RU having a high frequency. The first and second 996-tone RUs may be resource units including 996 tones.

If the first band is a 320 MHz band, the first subblock may be a first 2×996 tone RU having a low frequency, and the second subblock may be a second 2×996 tone RU having a high frequency. The first and second 2×996 tone RUs may be resource units including 2×996 tones.

When the PPDU is transmitted in a multi-user (MU) OFDMA scheme and the receiving STA includes first and second receiving STAs, it may be assumed that the first subblock is allocated to the first receiving STA, and the second subblock is allocated to the second receiving STA. In this case, the PPDU may be configured to transmit duplicated data for each receiving STA. For example, the first subblock includes first and second RUs, and data allocated to the first RU and data allocated to the second RU may be duplicated and transmitted to the first receiving STA. The second subblock includes third and fourth RUs, and data allocated to the third RU and data allocated to the fourth RU may be duplicated and transmitted to the second receiving STA. The first and second RUs have half the size of the first subblock, and the third and fourth RUs have half the size of the second subblock.

5. Device Configuration

The technical features of the present disclosure may be applied to various devices and methods. For example, the technical features of the present disclosure may be performed/supported through the device(s) of FIG. 1 and/or FIG. 11. For example, the technical features of the present disclosure may be applied to only part of FIG. 1 and/or FIG. 11. For example, the technical features of the present disclosure may be implemented based on the processing chip(s) 114 and 124 of FIG. 1, or implemented based on the processor(s) 111 and 121 and the memory(s) 112 and 122, or implemented based on the processor 610 and the memory 620 of FIG. 11. For example, the device according to the present disclosure receives a Physical Protocol Data Unit (PPDU) from a transmitting station (STA) through a first band, and decodes the PPDU.

The technical features of the present disclosure may be implemented based on a computer readable medium (CRM). For example, a CRM according to the present disclosure is at least one computer readable medium including instructions designed to be executed by at least one processor.

The CRM may store instructions that perform operations including receiving a Physical Protocol Data Unit (PPDU) from a transmitting STA through a first band and decoding the PPDU. At least one processor may execute the instructions stored in the CRM according to the present disclosure. At least one processor related to the CRM of the present disclosure may be the processor 111, 121 of FIG. 1, the processing chip 114, 124 of FIG. 1, or the processor 610 of FIG. 11. Meanwhile, the CRM of the present disclosure may be the memory 112, 122 of FIG. 1, the memory 620 of FIG. 11, or a separate external memory/storage medium/disk.

The foregoing technical features of the present specification are applicable to various applications or business models. For example, the foregoing technical features may be applied for wireless communication of a device supporting artificial intelligence (AI).

Artificial intelligence refers to a field of study on artificial intelligence or methodologies for creating artificial intelligence, and machine learning refers to a field of study on methodologies for defining and solving various issues in the area of artificial intelligence. Machine learning is also defined as an algorithm for improving the performance of an operation through steady experiences of the operation.

An artificial neural network (ANN) is a model used in machine learning and may refer to an overall problem-solving model that includes artificial neurons (nodes) forming a network by combining synapses. The artificial neural network may be defined by a pattern of connection between neurons of different layers, a learning process of updating a model parameter, and an activation function generating an output value.

The artificial neural network may include an input layer, an output layer, and optionally one or more hidden layers. Each layer includes one or more neurons, and the artificial neural network may include synapses that connect neurons. In the artificial neural network, each neuron may output a function value of an activation function of input signals input through a synapse, weights, and deviations.

A model parameter refers to a parameter determined through learning and includes a weight of synapse connection and a deviation of a neuron. A hyper-parameter refers to a parameter to be set before learning in a machine learning algorithm and includes a learning rate, the number of iterations, a mini-batch size, and an initialization function.

Learning an artificial neural network may be intended to determine a model parameter for minimizing a loss function. The loss function may be used as an index for determining an optimal model parameter in a process of learning the artificial neural network.

Machine learning may be classified into supervised learning, unsupervised learning, and reinforcement learning.

Supervised learning refers to a method of training an artificial neural network with a label given for training data, wherein the label may indicate a correct answer (or result value) that the artificial neural network needs to infer when the training data is input to the artificial neural network. Unsupervised learning may refer to a method of training an artificial neural network without a label given for training data. Reinforcement learning may refer to a training method for training an agent defined in an environment to choose an action or a sequence of actions to maximize a cumulative reward in each state.

Machine learning implemented with a deep neural network (DNN) including a plurality of hidden layers among artificial neural networks is referred to as deep learning, and deep learning is part of machine learning. Hereinafter, machine learning is construed as including deep learning.

The foregoing technical features may be applied to wireless communication of a robot.

Robots may refer to machinery that automatically process or operate a given task with own ability thereof. In particular, a robot having a function of recognizing an environment and autonomously making a judgment to perform an operation may be referred to as an intelligent robot.

Robots may be classified into industrial, medical, household, military robots and the like according uses or fields. A robot may include an actuator or a driver including a motor to perform various physical operations, such as moving a robot joint. In addition, a movable robot may include a wheel, a brake, a propeller, and the like in a driver to run on the ground or fly in the air through the driver.

The foregoing technical features may be applied to a device supporting extended reality.

Extended reality collectively refers to virtual reality (VR), augmented reality (AR), and mixed reality (MR). VR technology is a computer graphic technology of providing a real-world object and background only in a CG image, AR technology is a computer graphic technology of providing a virtual CG image on a real object image, and MR technology is a computer graphic technology of providing virtual objects mixed and combined with the real world.

MR technology is similar to AR technology in that a real object and a virtual object are displayed together. However, a virtual object is used as a supplement to a real object in AR technology, whereas a virtual object and a real object are used as equal statuses in MR technology.

XR technology may be applied to a head-mount display (HMD), a head-up display (HUD), a mobile phone, a tablet PC, a laptop computer, a desktop computer, a TV, digital signage, and the like. A device to which XR technology is applied may be referred to as an XR device.

The claims recited in the present specification may be combined in a variety of ways. For example, the technical features of the method claims of the present specification may be combined to be implemented as a device, and the technical features of the device claims of the present specification may be combined to be implemented by a method. In addition, the technical characteristics of the method claim of the present specification and the technical characteristics of the device claim may be combined to be implemented as a device, and the technical characteristics of the method claim of the present specification and the technical characteristics of the device claim may be combined to be implemented by a method.

What is claimed is:

1. A method in a wireless local area network (WLAN) system, the method comprising:
   receiving, by a receiving station (STA), a Physical Protocol Data Unit (PPDU) from a transmitting STA; and
   decoding, by the receiving STA, the PPDU,
   wherein the PPDU includes a preamble and a data,
   wherein the transmitted data in the PPDU is duplicated in frequency, and
   wherein, for the PPDU transmitted in an Extremely High Throughput (EHT) duplicate (DUP) mode, encoded with Binary Phase Shift Keying-Dual Carrier Modulation (BPSK-DCM) for a lower resource unit (RU), and the lower RU is duplicated to a higher RU.

2. The method of claim 1, wherein encoded data bits are distributed only to the lower RU,
   wherein constellation mapping and low density parity check (LDPC) tone mapping are performed on the encoded data bits in the lower RU based on the BPSK-DCM,
   wherein a first pilot tone for first data is inserted into the lower RU after the first data is generated,
   wherein a second pilot tone for second data is inserted into the higher RU after the second data is generated.

3. The method of claim 1, wherein based on a bandwidth of the PPDU being 80 MHz, the lower RU is a first 484-tone RU having a low frequency, and the higher RU is a second 484-tone RU having a high frequency,
   wherein the first and second 484-tone RUs are resource units including 484 tones.

4. The method of claim 3, wherein based on the bandwidth of the PPDU being 160 MHz, the lower RU is a first 996-tone RU having a low frequency, and the higher RU is a second 996-tone RU having a high frequency,
- wherein the first and second 996-tone RUs are resource units including 996 tones.

5. The method of claim 1, wherein based on a bandwidth of the PPDU being 320 MHz, the lower RU is a first 2×996 tone RU having a low frequency, and the higher RU is a second 2×996 tone RU having a high frequency,
- wherein the first and second 2×996 tone RUs are resource units including 2×996 tones.

6. The method of claim 1, wherein the encoded data bits are modulated based on a first Modulation and Coding Scheme (MCS),
- wherein the preamble includes an Extremely High Throughput-Signal (EHT-SIG),
- wherein information on the first MCS is included in a user field of the EHT-SIG,
- wherein the PPDU is a single-user (SU) PPDU supporting a single spatial stream.

7. A receiving station (STA) configured to operate in a wireless local area network (WLAN) system, the receiving STA comprising:
- a transceiver;
- a processor operatively connected to the transceiver; and
- a memory operatively connected to the processor and storing instructions that, when executed by the processor, perform operations comprising:
- receiving a Physical Protocol Data Unit (PPDU) from a transmitting station (STA), and
- decoding the PPDU,
- wherein the PPDU includes a preamble and a data,
- wherein the transmitted data in the PPDU is duplicated in frequency, and
- wherein, for the PPDU transmitted in an Extremely High Throughput (EHT) duplicate (DUP) mode, encoded with Binary Phase Shift Keying-Dual Carrier Modulation (BPSK-DCM) for a lower resource unit (RU), and the lower RU is duplicated to a higher RU.

8. A method in a wireless local area network (WLAN) system, the method comprising:
- generating, by a transmitting station (STA), a Physical Protocol Data Unit (PPDU); and
- transmitting, by the transmitting STA, the PPDU to a receiving STA through a first band,
- wherein the PPDU includes a preamble and a data,
- wherein the transmitted data in the PPDU is duplicated in frequency, and
- wherein, for the PPDU transmitted in an Extremely High Throughput (EHT) duplicate (DUP) mode, encoded with Binary Phase Shift Keying-Dual Carrier Modulation (BPSK-DCM) for a lower resource unit (RU), and the lower RU is duplicated to a higher RU.

9. The method of claim 8, wherein encoded data bits are distributed only to the lower RU,
- wherein constellation mapping and low density parity check (LDPC) tone mapping are performed on the encoded data bits in the lower RU based on the BPSK-DCM,
- wherein a first pilot tone for first data is inserted into the lower RU after the first data is generated,
- wherein a second pilot tone for second data is inserted into the higher RU after the second data is generated.

10. The method of claim 8, wherein based on a bandwidth of the PPDU being 80 MHz, the lower RU is a first 484-tone RU having a low frequency, and the higher RU is a second 484-tone RU having a high frequency,
- wherein the first and second 484-tone RUs are resource units including 484 tones.

11. The method of claim 8, wherein based on a bandwidth of the PPDU being 160 MHz, the lower RU is a first 996-tone RU having a low frequency, and the higher RU is a second 996-tone RU having a high frequency,
- wherein the first and second 996-tone RUs are resource units including 996 tones.

12. The method of claim 8, wherein based on a bandwidth of the PPDU being 320 MHz, the lower RU is a first 2×996 tone RU having a low frequency, and the higher RU is a second 2×996 tone RU having a high frequency,
- wherein the first and second 2×996 tone RUs are resource units including 2×996 tones.

13. The method of claim 8, wherein the encoded data bits are modulated based on a first Modulation and Coding Scheme (MCS),
- wherein the preamble includes an Extremely High Throughput-Signal (EHT-SIG),
- wherein information on the first MCS is included in a user field of the EHT-SIG,
- wherein the PPDU is a single-user (SU) PPDU supporting a single spatial stream.

* * * * *